United States Patent
Nezuka

(10) Patent No.: US 10,581,452 B2
(45) Date of Patent: Mar. 3, 2020

(54) A/D CONVERTER

(71) Applicant: DENSO CORPORATION, Kariya, Aichi-pref. (JP)

(72) Inventor: Tomohiro Nezuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/196,273

(22) Filed: Nov. 20, 2018

(65) Prior Publication Data

US 2019/0089369 A1    Mar. 21, 2019

Related U.S. Application Data

(63) Continuation of application No. PCT/JP2017/014906, filed on Apr. 12, 2017.

(30) Foreign Application Priority Data

May 31, 2016  (JP) .................................. 2016-108556

(51) Int. Cl.
| H03M 3/00 | (2006.01) |
| H03M 1/14 | (2006.01) |
| H03M 3/02 | (2006.01) |
| H03M 1/12 | (2006.01) |

(52) U.S. Cl.
CPC ............. *H03M 3/424* (2013.01); *H03M 1/12* (2013.01); *H03M 1/14* (2013.01); *H03M 3/02* (2013.01); *H03M 3/438* (2013.01); *H03M 3/46* (2013.01)

(58) Field of Classification Search
CPC .......... H03M 3/424; H03M 1/12; H03M 3/02; H03M 3/46; H03M 3/438
USPC .................................................. 341/155, 143
See application file for complete search history.

(56) References Cited

U.S. PATENT DOCUMENTS

| 7,916,061 B2 | 3/2011 | Chae et al. |
| 8,797,455 B2 | 8/2014 | Gou et al. |
| 9,077,373 B1 | 7/2015 | Nezuka et al. |
| 9,264,064 B2 | 2/2016 | Saito |
| 9,685,967 B1 * | 6/2017 | Motz ........................ H03M 3/34 |
| 9,843,337 B1 * | 12/2017 | Li ......................... H03M 1/0673 |

(Continued)

FOREIGN PATENT DOCUMENTS

JP    2015-133626 A    7/2015

OTHER PUBLICATIONS

Rombouts et al., "A very compact 1MS/s Nyquist-rate A/D-converter with 12 effective bits for use as a standard cell," Proceedings of the European Solid-State Circuits Conference 2012, pp. 213-216, Sep. 2012.

(Continued)

*Primary Examiner* — Brian K Young
(74) *Attorney, Agent, or Firm* — Posz Law Group, PLC

(57) ABSTRACT

An A/D converter includes: an integrator circuit executing ΔΣ modulation to an analog signal to be converted; an adder outputting an addition result of at least an output signal of the integrator circuit and a first reference signal as a reference signal of ΔΣ modulation; a quantizer receives an output signal of the integrator circuit, an output signal of the adder, and a second reference signal as a reference signal in cyclic A/D conversion to generate a result of quantization of the output signal of the integrator circuit and the output signal of the adder; and a controller is configured to switch between a ΔΣ modulation mode and a cyclic mode.

11 Claims, 12 Drawing Sheets

(56) References Cited

U.S. PATENT DOCUMENTS 9,979,411 B1 * 5/2018 Gupta .................. H03M 3/376
10,135,459 B2 * 11/2018 Sharma .............. A61B 5/04284

OTHER PUBLICATIONS

Lynden et al., "A single shot sigma delta analog to digital converter for multiplexed applications," Proceedings of the IEEE Custom Integrated Circuits Conference 1995, pp. 203-206, May 1995.
Rombouts et al., "A 13.5-b 1.2-V Micropower Extended Counting A/D Converter," IEEE Journal of Solid-State Circuits, vol. 36, No. 2, pp. 176-183, Feb. 2001.

* cited by examiner

US 10,581,452 B2

A/D CONVERTER

CROSS REFERENCE TO RELATED APPLICATIONS

The present application is a continuation application of International Patent Application No. PCT/JP2017/014906 filed on Apr. 12, 2017, which designated the U.S. and claims the benefit of priority from Japanese Patent Application No. 2016-108556 filed on May 31, 2016. The entire disclosures of all of the above applications are incorporated herein by reference.

TECHNICAL FIELD

The present disclosure relates to an A/D converter.

BACKGROUND

With the progress of digitization in communications and signal processing systems, A/D converters capable of accomplishing high-speed and high-accuracy A/D conversion are sought after to accommodate the demands for increasing the communication bandwidth and processing speed.

SUMMARY

The present disclosure provides an A/D converter that includes: an integrator circuit that executes $\Delta\Sigma$ modulation to an analog signal; an adder that outputs an addition result of at least an output signal of the integrator circuit and a first reference signal in the $\Delta\Sigma$ modulation; a quantizer that receives the output signal of the integrator circuit, an output signal of the adder, and a second reference signal in cyclic A/D conversion to generate a result of quantization of the output signal; and a controller that switches the A/D converter to operate either in a $\Delta\Sigma$ modulation mode or in a cyclic mode, and generates an A/D conversion result of the analog signal.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
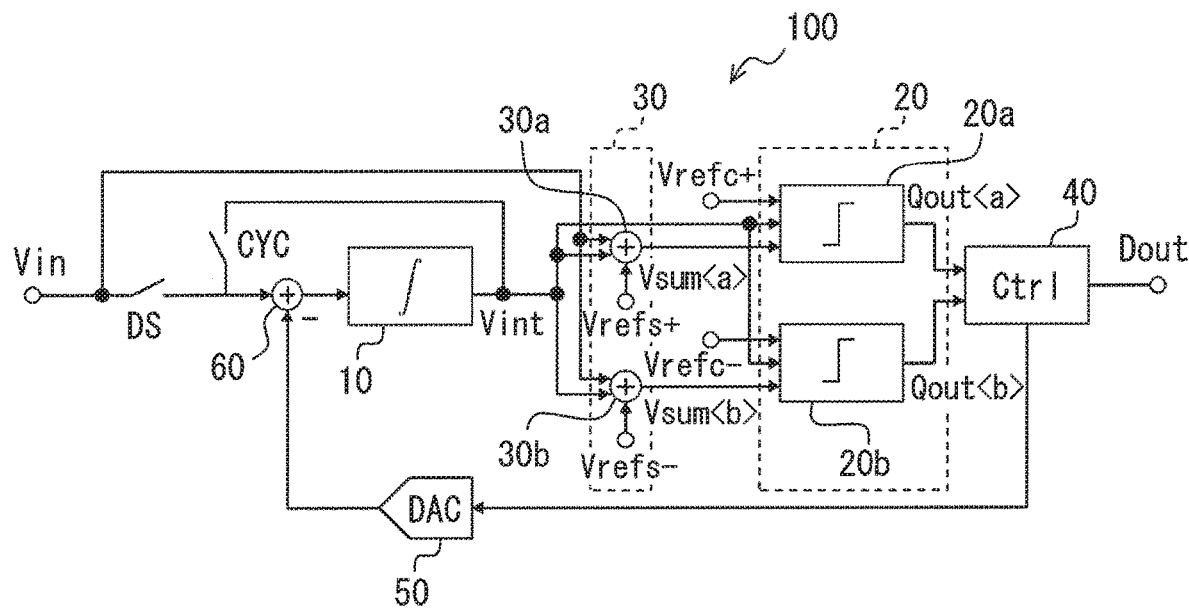
FIG. 1 is a block diagram illustrating a configuration of an A/D converter in a first embodiment.

Various A/D conversion schemes have been proposed. For example, there are hybrid A/D converters that combine a $\Delta\Sigma$ A/D converter and a cyclic A/D converter. While $\Delta\Sigma$ A/D converters have higher conversion accuracy than those of cyclic A/D converters, the conversion speed of cyclic A/D converters is faster than those of $\Delta\Sigma$ A/D converters. Such hybrid A/D converters realize high-speed and high-accuracy A/D conversion by adopting the $\Delta\Sigma$ scheme for high-order bit A/D conversion that requires high accuracy, while switching to the cyclic scheme for low-order bit A/D conversion.

In hybrid A/D converters, the amplitude of the output signal from an integrator circuit that forms the $\Delta\Sigma$ A/D converter left after the execution of $\Delta\Sigma$ A/D conversion, i.e., the residue of A/D conversion, is dependent on the amplification factor of the integrator circuit. In order to efficiently increase the resolution of the hybrid A/D converter by effectively utilizing the resolution of the cyclic A/D converter used for low-order bit A/D conversion, it is desirable to set the amplification factor of the integrator circuit as high as possible within a range where the output signal amplitude of the integrator circuit falls within the input range of the cyclic A/D converter. On the other hand, when using a feedback $\Delta\Sigma$ A/D converter as the first stage of the hybrid A/D converter, for example, the output signal amplitude of the integrator circuit tends to be large, because the output of the integrator circuit during the process of $\Delta\Sigma$ A/D conversion includes a signal component corresponding to the analog input signal that is the conversion target of A/D conversion, in addition to the residue of A/D conversion, and in order to avoid saturation of the output of the integrator circuit, the amplification factor of the integrator circuit need to be reduced.

A hybrid A/D converter adopts feed-forward $\Delta\Sigma$ modulation wherein, when executing $\Delta\Sigma$ A/D conversion, the sum of the output of the integrator circuit and the analog input signal is quantized. This way, the output signal amplitude of the integrator circuit can be kept small while the amplification factor of the integrator circuit is maintained high. Moreover, the quantizer used in the ΔΣ A/D converter is used again when executing cyclic A/D conversion, so that two types of A/D conversions, ΔΣ and cyclic, are realized efficiently with a reduced amount of hardware.

However, the addition of the analog input signal and the output signal of the integrator circuit for realizing feed-forward ΔΣ modulation, and the quantization, are executed by an adding quantizer, which is a quantizer including a function as an adder. The adding quantizer is configured by a differential amplifier, to which three sets of differential signals, i.e., the output signal of the integrator circuit, the analog input signal, and reference voltages used for the quantization, can be input. Accordingly, errors in addition operations tend to be large as compared to a configuration wherein the adding function is provided by a dedicated circuit that uses a switched capacitor circuit or the like. However, errors occur in quantization in the ΔΣ A/D conversion, and that the quantization errors lead to errors in the output signal of the integrator circuit.

The present disclosure provides a high-speed, high-accuracy, small hybrid A/D converter that adopts feed-forward ΔΣ modulation, wherein the feed-forward ΔΣ modulation is executed highly accurately with an increased amplification factor of the integrator circuit for higher efficiency of cyclic A/D conversion, suppressing the amount of hardware by sharing the same quantizer in two types, ΔΣ and cyclic, of A/D conversions.

According to an aspect of the present disclosure, an A/D converter includes: an integrator circuit that executes ΔΣ modulation to an analog signal as an input signal to be converted; an adder that outputs an addition result of at least an output signal of the integrator circuit and a first reference signal as a reference signal in the ΔΣ modulation; a quantizer that receives the output signal of the integrator circuit, an output signal of the adder, and a second reference signal as a reference signal in cyclic A/D conversion to generate a result of quantization of the output signal of the integrator circuit and the output signal of the adder; and a controller that switches the A/D converter to operate either in a ΔΣ modulation mode or in a cyclic mode, and that generates an A/D conversion result of the analog signal based on the quantization result.

The controller controls the integrator circuit, the adder, and the quantizer to operate as a ΔΣ modulator in the ΔΣ modulation mode, and controls the integrator circuit and the quantizer to operate as a cyclic A/D converter in the cyclic mode.

The quantizer includes: a comparator; and a switch unit interposed between the integrator circuit and the comparator and between the adder and the comparator to switch over mutual connection states of the integrator circuit, the adder and the comparator.

The controller controls the switch unit to input only the addition result to the comparator in the ΔΣ modulation mode, and controls the switch unit to input the output signal of the integrator circuit and the second reference signal to the comparator in the cyclic mode.

By switching the input signal to the comparator between the ΔΣ modulation mode and the cyclic mode, the A/D converter can operate as a feed-forward ΔΣ modulator in the ΔΣ modulation mode, while, in the cyclic mode, the output of the integrator circuit is directly connected to the input of the comparator without the adder therebetween to execute cyclic A/D conversion.

More specifically, in A/D conversion based on ΔΣ modulation, the analog signal, the output signal of the integrator circuit, and the first reference signal are added first by the adder, the result being then quantized by a comparator having substantially one set of differential inputs, i.e., the output signal of the adder alone, as input signal. Therefore, the accuracy of addition operations, and of quantization, can be improved. In cyclic A/D conversion, on the other hand, the quantizer operates as a comparator having two sets of differential inputs, i.e., the second reference signal and the output signal of the integrator circuit, without the adder, so that A/D conversion is executed at high speed and with high accuracy.

Embodiments of the present disclosure will be hereinafter described with reference to the drawings. Parts identical or equivalent to each other among various drawings are given the same reference signs.

First Embodiment

First, a schematic configuration of an A/D converter according to the present embodiment will be described with reference to FIG. 1 to FIG. 4.

This A/D converter is a hybrid A/D converter that has two types of A/D converters that perform ΔΣ A/D conversion and cyclic A/D conversion, and operates either in an A/D conversion mode based on ΔΣ modulation (ΔΣ modulation mode) or in a cyclic A/D conversion mode (cyclic mode) that are switched between one another in accordance with required A/D conversion accuracy and conversion speed.

As shown in FIG. 1, the A/D converter 100 of the present embodiment outputs a digital signal Dout when an analog signal Vin is input.

The A/D converter 100 includes an integrator circuit 10, a quantizer 20, an adder 30, a controller 40, a DAC 50, and a subtractor 60. The A/D converter 100 of the present embodiment executes single ΔΣ modulation wherein A/D conversion is performed to the analog signal Vin using one integrator circuit 10 and one DAC 50.

The analog signal Vin can be input to the integrator circuit 10 via a switch DS and the subtractor 60. The integrator circuit 10 includes an op-amp and an integrator capacitor (not shown). Hereinafter, the switches provided for A/D conversion based on ΔΣ modulation shall be denoted as DS, while the switches provided for cyclic A/D conversion shall be denoted as CYC (or CYC1/CYC2).

In A/D conversion based on ΔΣ modulation, the integrator circuit 10 integrates a difference between the analog signal Vin and a signal corresponding to a quantization result Qout to be described later calculated by the subtractor 60, and outputs Vint as an output signal of the integrator circuit 10. The integrator circuit 10 outputs Vint+ and Vint− of opposite polarities as the output signal Vint, because the A/D converter 100 in the present embodiment operates with differential signals.

In cyclic A/D conversion, the integrator circuit 10 outputs results of subtraction, by the DAC 50 and subtractor 60, of the residue of A/D conversion left in the output of the integrator circuit 10, and of an amplification operation by the integrator circuit 10, again as the output signal Vint of the integrator circuit 10. The output terminal of the integrator circuit 10 and the input terminal of the subtractor 60 of the A/D converter 100 are connected to each other via a switch CYC as shown in FIG. 1 so that the output signal Vint of the integrator circuit 10 can be input to the subtractor 60.

The quantizer 20, to which the output signal Vint of the integrator circuit 10, or an addition result Vsum that is the output signal of the adder 30 to be described later is input, quantizes these output signals and outputs a quantization result Qout. The quantizer 20 of the present embodiment is a 1.5-bit quantizer having a quantizer 20a and a quantizer 20b. Vint, Vsum, and a reference signal Vrefc to be described later are input to each of the quantizer 20a and the quantizer 20b.

A specific configuration of the quantizer 20 will be described with reference to FIG. 2. The quantizer 20 includes the quantizer 20a and quantizer 20b as noted above, which have the same configuration, except for the polarity of the input reference signal Vrefc. The parenthesized signal names (polarities) in FIG. 2 are the signal names of the quantizer 20b.

Figure 2:
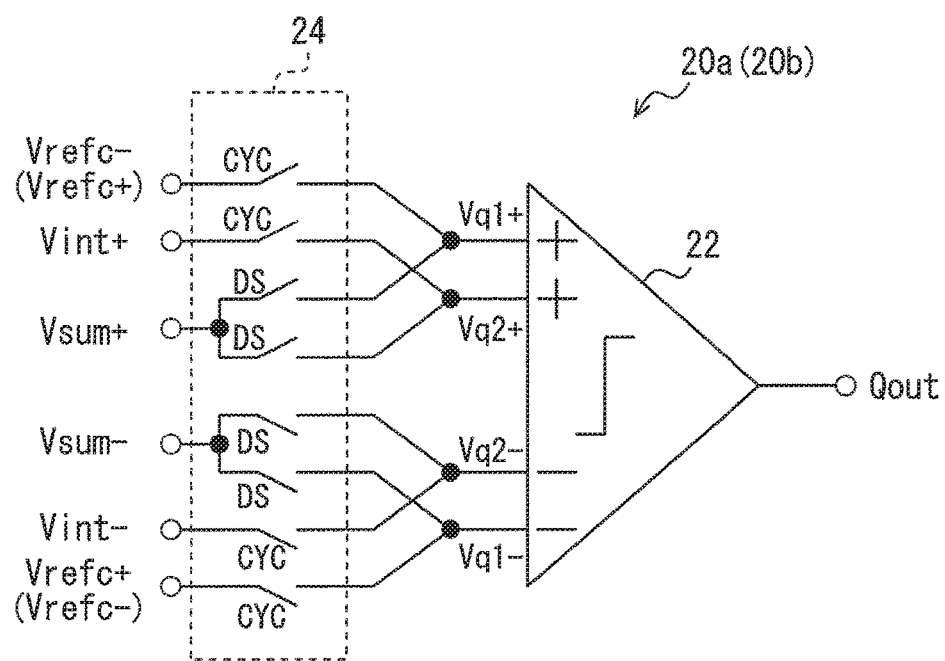
FIG. 2 is a circuit diagram illustrating a detailed configuration of a quantizer.

As shown in FIG. 2, the quantizer 20a has a comparator 22 with 4 inputs (2 sets of differential signals) and 1 output. The comparator 22 includes two non-inverted input terminals, two inverted input terminals, and one output terminal.

The quantizer 20a has a switch unit 24 that controls connection states between the integrator circuit 10 and the comparator 22, and between the adder 30 to be described later and the comparator 22. The switch unit 24 in the present embodiment converts 6 inputs of the quantizer 20a (3 sets of differential signals) into 4 Inputs (2 sets of differential signals) to be input to the comparator 22. The signals input to the quantizer 20a, i.e., to the switch unit 24, are, as shown in FIG. 1 and FIG. 2, second reference signals Vrefc− and Vrefc+ of opposite polarities, which will be the reference voltages of the comparator 22 in the cyclic mode, the output signals Vint+ and Vint− of opposite polarities of the integrator circuit 10, and the output signals or addition results Vsum+ and Vsum− of opposite polarities of the adder 30.

An index sign <a> is added to various signals input to the quantizer 20a. For example, Vrefc− and Vint+ input to the quantizer 20a are denoted as Vrefc−<a> and Vint+<a>, respectively. An index sign <b> is added to various signals input to the quantizer 20b. For example, Vrefc+ and Vsum+ input to the quantizer 20b are denoted as Vrefc+<b> and Vsum+<b>, respectively.

The second reference signal Vrefc− can be input to one of the non-inverted input terminals of the comparator 22 via the switch CYC. Voltage input to this non-inverted input terminal is denoted as Vq1+. More specifically, the voltage input to the quantizer 20a is denoted as Vq1+<a>, and the voltage input to the quantizer 20b is denoted as Vq1+<b>. That is to say, when the switch CYC is on, Vq1+<a> equals to Vrefc−<a>. Vq1+<b> equals to Vrefc+<b>, which has the opposite polarity of Vrefc−.

The output signal Vint+ of the integrator circuit 10 can be input to the other non-inverted input terminal of the comparator 22 via the switch CYC. Voltage input to this non-inverted input terminal is denoted as Vq2+. More specifically, the voltage input to the quantizer 20a is denoted as Vq2+<a>, and the voltage input to the quantizer 20b is denoted as Vq2+<b>. That is to say, when the switch CYC is on, Vq2+ equals to Vint+.

The addition result Vsum+ that is the output signal of the adder 30 can be input to both of the two non-inverted input terminals of the comparator 22 via the switches DS. When the switches DS are on, Vq1+<a> and Vq2+<a> are each equal to Vsum+<a>, and Vq1+<b> and Vq2+<b> are each equal to Vsum+<b>.

The second reference signal Vrefc+ can be input to one of the inverted input terminals of the comparator 22 via the switch CYC. Voltage input to this inverted input terminal is denoted as Vq1−. More specifically, the voltage input to the quantizer 20a is denoted as Vq1−<a>, and the voltage input to the quantizer 20b is denoted as Vq1−<b>. That is to say, when the switch CYC is on, Vq1−<a> equals to Vrefc+<a>. Vq1−<b> equals to Vrefc−<b>, which has the opposite polarity of Vrefc+.

The output signal Vint− of the integrator circuit 10 can be input to the other inverted input terminal of the comparator 22 via the switch CYC. Voltage input to this inverted input terminal is denoted as Vq2−. More specifically, the voltage input to the quantizer 20a is denoted as Vq2−<a>, and the voltage input to the quantizer 20b is denoted as Vq2−<b>. That is to say, when the switch CYC is on, Vq2− equals to Vint−.

The addition result Vsum− that is the output signal of the adder 30 can be input to both of the two inverted input terminals of the comparator 22 via the switches DS. When the switches DS are on, Vq1−<a> and Vq2−<a> are each equal to Vsum−<a>, and Vq1−<b> and Vq2−<b> are each equal to Vsum−<b>.

Figure 3:
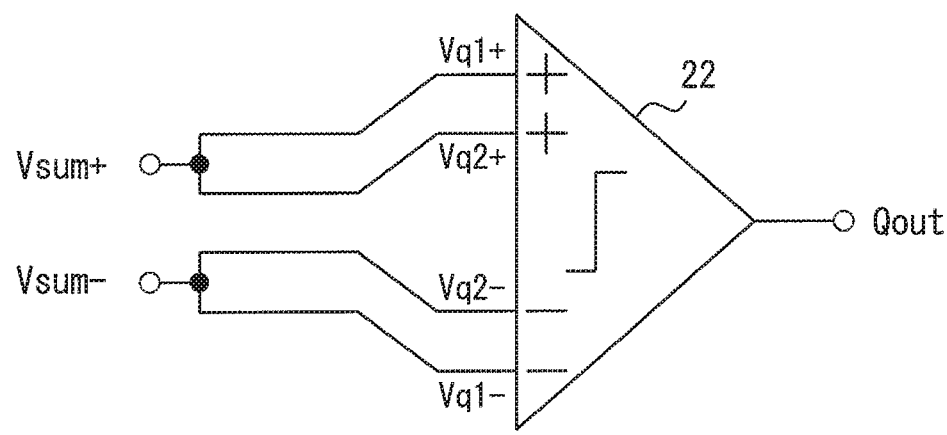
FIG. 3 is a circuit diagram illustrating a connection state of the quantizer in a $\Delta\Sigma$ modulation mode.

As mentioned above, the switches DS are turned on in the $\Delta\Sigma$ modulation mode. Therefore, the comparator 22 in the $\Delta\Sigma$ modulation mode functions as a single differential comparator that compares only one set of differential signals, Vsum+ and Vsum−, which are substantially the output signals of the adder 30, as shown in FIG. 3.

Figure 4:
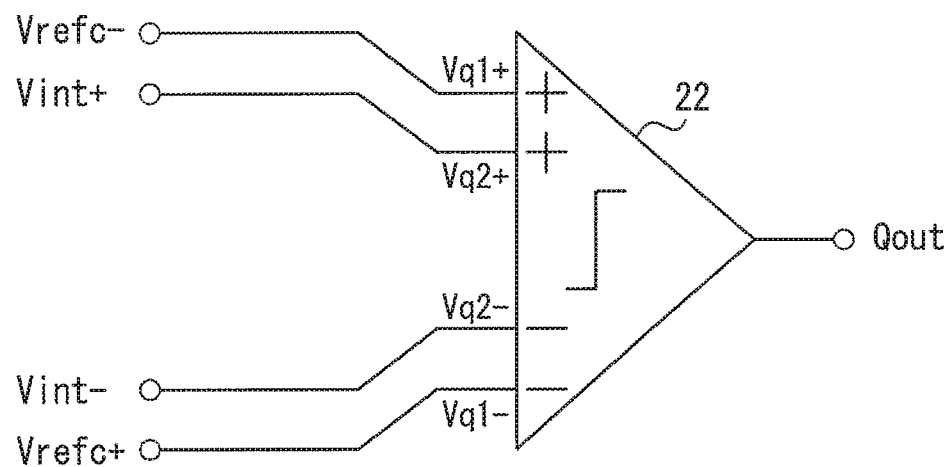
FIG. 4 is a circuit diagram illustrating a connection state of the quantizer in a cyclic mode.

The switches CYC are turned on in the cyclic mode. The comparator 22 in the cyclic mode therefore functions as a comparator that compares two pairs of differential inputs, a difference between Vint+ and Vint−, and a difference between Vrefc+ and Vrefc−, as shown in FIG. 4.

The adder 30 is an adder that adds input signals and outputs the addition results. Signals input to the adder 30 are, as shown in FIG. 1, first reference signals Vrefs+ and Vrefs− of opposite polarities that are the reference voltages in the $\Delta\Sigma$ modulation mode, the analog signals Vin+ and Vin− of opposite polarities that are the conversion target, and the output signals Vint+ and Vint− of opposite polarities of the integrator circuit 10. The adder 30 includes two adders 30a and 30b corresponding to the quantizer 20. The adder 30a and adder 30b have the same configuration, except for the polarity of the first reference signal Vrefs.

The adder 30a or adder 30b performs addition based on input signals, and outputs the results to the quantizer 20 as Vsum. More specifically, the adder 30a outputs an addition result Vsum<a>, which is a result of addition of Vin, Vint, and Vrefs (Vrefs+ in FIG. 1), to the quantizer 20a. The adder 30b outputs an addition result Vsum<b>, which is a result of addition of Vin, Vint, and reference signal Vrefs of the opposite polarity (Vrefs− in FIG. 1), to the quantizer 20b. The addition results Vsum<a> and Vsum<b> contain Vin components that are analog signals to be converted, and the addition results are input to the quantizer 20 in the $\Delta\Sigma$ modulation mode. That is to say, the A/D converter 100 configures a feed-forward $\Delta\Sigma$ modulator in the $\Delta\Sigma$ modulation mode.

The controller 40 generates A/D conversion results Dout of analog signals Vin based on the quantization results Qout generated by the quantizer 20. The controller 40 controls the DAC 50 to be described later based on Qout thereby to control the output from the DAC 50 to the subtractor 60 to be described later. The controller 40 of the present embodiment controls the DAC 50 based on Qout<a:b> corresponding to combinations of the output signal Qout<a> of the quantizer 20a and the output signal Qout<b> of the quantizer 20b. For example, if Qout<a>=0 and Qout<b>=0, then Qout<a:b>=−1. If Qout<a>=0 and Qout<b>=1, then Qout<a:b>=0. If Qout<a>=1 and Qout<b>=1, then Qout<a:b>=1.

The controller 40 also controls various switches that configure the A/D converter 100. More specifically, the controller turns on the switches DS and turns off the switches CYC in the ΔΣ modulation mode, while it turns off the switches DS and turns on the switches CYC in the cyclic mode.

The DAC 50 is a commonly known capacitive D/A converter, for example. The DAC 50 inputs a preset voltage to a DAC capacitor (not shown) based on the quantization result Qout and the control signal output from the controller 40. Subtraction is performed by the subtractor 60 based on the voltage input to the DAC capacitor.

Figure 6:
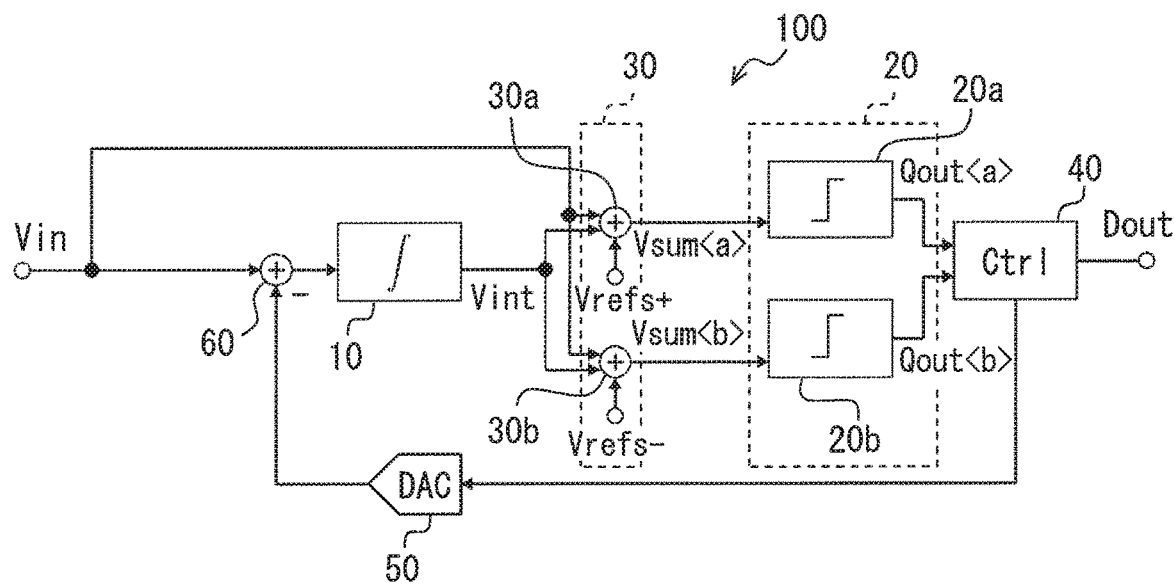
FIG. 6 is a circuit diagram illustrating a connection state of the A/D converter in the $\Delta\Sigma$ modulation mode.
Figure 7:
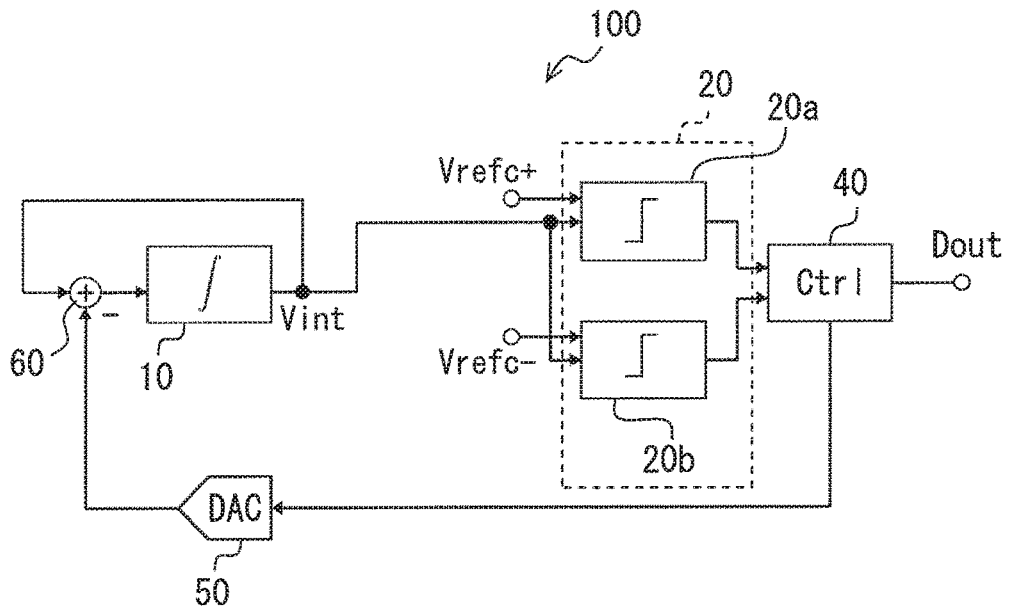
FIG. 7 is a circuit diagram illustrating a connection state of the A/D converter in the cyclic mode.

Next, the operation of the A/D converter 100 will be described with reference to FIG. 5 to FIG. 7.

Figure 5:
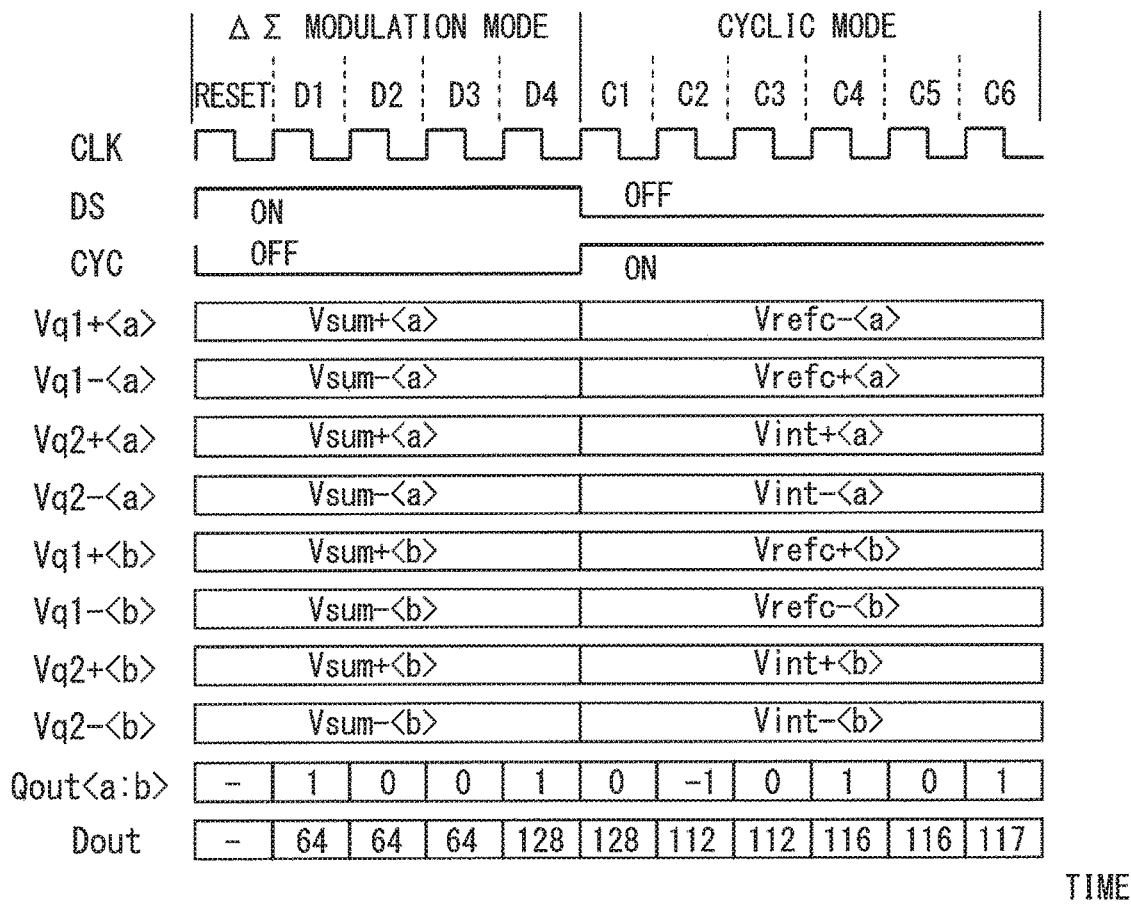
FIG. 5 is a chronological timing chart showing the operation of the A/D converter.

FIG. 5 shows a timing chart of the operation of the A/D converter 100 according to the present embodiment. CLK represents a reference clock. FIG. 5 shows the timing of the reference clock being in a state of high or low, with the horizontal axis representing time. DS represents a state of ON or OFF of the switches DS. When DS is High, the switches DS are on, and when DS is Low, the switches DS are off. CYC represents a state of ON or OFF of the switches CYC. When CYC is High, the switches CYC are on, and when CYC is Low, the switches CYC are off. Vq1+<a> to Vq2−<b> represent each of the signals input to the input terminal of the quantizer 20. Qout<a:b> represents results of logical operations based on Qout<a> and Qout<b>. Qout<a:b> values are shown in FIG. 5 as one example of an A/D conversion operation. Dout represents values generated by calculating the Qout<a:b> values by the controller 40, or the results of A/D conversion of the analog signal Vin. In this example, 4 cycles of quantization are executed in the ΔΣ modulation mode after a reset operation, after which 6 cycles of quantization are executed in the cyclic mode. Namely, an A/D conversion is completed in 11 clock cycles including the reset operation.

More specifically, as shown in FIG. 5, a reset operation is executed first. In the reset operation, the switches DS are turned on, and the potential of the capacitive elements, op-amps and the like included in the integrator circuit 10 and DAC 50 is reset to a predetermined level such as the analog ground level.

Next, the controller 40 causes the A/D converter 100 to operate in the ΔΣ modulation mode. More specifically, the controller turns on the switches DS and turns off the switches CYC. This brings the quantizer 20 to the connection state shown in FIG. 3, and the A/D converter 100 shown in FIG. 1 and FIG. 2 substantially to the connection state shown in FIG. 6. Namely, the quantizers 20a and 20b each function as comparators having substantially one pair of differential signals as inputs. The signals input to the quantizers 20a and 20b in this state further include the output signal Vsum of the adder 30 that is the result of adding the first reference signal Vrefs to Vint and Vin.

More specifically, in the ΔΣ modulation mode, the A/D converter 100 integrates, by the integrator circuit 10, the result of subtracting the output signal of the DAC 50 from the analog signal Vin performed by the subtractor 60, after which it executes addition by the adder 30, and quantizes the output signal of the adder 30 by the quantizer 20. The A/D converter 100 operates as a feed-forward ΔΣ modulator this way wherein the adder 30 adds the analog signal Vin to the output signal of the integrator circuit 10.

In the A/D conversion of the present embodiment, 4 cycles of quantization are executed in the ΔΣ modulation mode. That is, as shown in FIG. 5, the result of quantization Qout<a:b> by the quantizer 20 changes from 1 to 0, 0 to 0, and 0 to 1 during the 4 cycles of quantization, and by accumulating the quantization results, A/D conversion results are obtained, which correspond to high-order bits of the A/D conversion results Dout of the A/D converter 100. The Dout values in FIG. 5 take into consideration the weights of the A/D conversion results obtained by ΔΣ modulation relative to the A/D conversion results Dout. The results of 4 cycles of quantization in the ΔΣ modulation mode are reflected to Dout as a result of multiplying the integral value of Qout<a:b> with the weight 64. Thus, Dout changes from 64 to 64, from 64 to 64, and from 64 to 128.

Next, the controller 40 causes the A/D converter 100 to operate in the cyclic mode. More specifically, the controller turns on the switches CYC and turns off the switches DS. This brings the quantizer 20 to the connection state shown in FIG. 4, and the A/D converter 100 shown in FIG. 1 and FIG. 2 substantially to the connection state shown in FIG. 7. Namely, the quantizers 20a and 20b each function as comparators having two pairs of differential inputs. The signals input to the quantizers 20a and 20b in this state are the output signals Vint+ and Vint− of the integrator circuit 10, and the second reference signals Vrefc+ and Vrefc−.

In the cyclic mode, the quantizer 20 executes 1.5-bit quantization, with the second reference signals Vrefc+ and Vrefc− as thresholds. In the present embodiment, 6 cycles of A/D conversion are executed in the cyclic mode. Namely, as shown in FIG. 5, Qout<a:b> changes from 0 to −1, from −1 to 0, from 0 to 1, from 1 to 0, and from 0 to 1 during the 6 cycles of cyclic A/D conversion, and the A/D conversion result Dout changes from 128 to 112, from 112 to 112, from 112 to 116, from 116 to 116, and from 116 to 117, as a result of suitable weighted addition of the quantization result to the A/D conversion result Dout similarly to a common cyclic A/D converter.

Next, the effects of adopting the A/D converter 100 of the present embodiment will be described.

The A/D converter 100 of the present embodiment switches the input signals to the comparator 22 between the ΔΣ modulation mode and the cyclic mode using the switch unit 24, wherein, in the ΔΣ modulation mode, the output of the adder 30 is connected to the comparator 22 so that the converter operates as a feed-forward ΔΣ modulator, while, in the cyclic mode, the output of the integrator circuit 10 is connected to the comparator 22 without the adder 30 therebetween so that the converter operates as a cyclic A/D converter.

More specifically, in A/D conversion based on ΔΣ modulation performed by the A/D converter 100, the analog signal Vin, the output signal of the integrator circuit 10, and the reference voltage (first reference signal) are added first by the adder 30, before the quantizer 20 performs quantization, wherein it operates as a comparator having substantially one set of differential inputs, i.e., the output signal of the adder 30 alone, as the input signal. Therefore, the accuracy of addition operations, and of quantization, can be improved as compared to conventional configurations. In cyclic A/D conversion, on the other hand, the quantizer 20 operates as a comparator 22 having two sets of differential signals as inputs, i.e., the reference voltage (second reference signal) and the output of the integrator circuit 10, without the adder 30, so that A/D conversion is executed at high speed and with high accuracy without being affected by the operating speed of the adder 30.

Second Embodiment

The basic configuration of the A/D converter 100 based on single ΔΣ modulation described in the first embodiment can be modified as required. In the configuration illustrated in the first embodiment, 1 cycle of A/D conversion is performed per clock cycle in the cyclic mode. In the present embodiment, a configuration capable of performing 2 cycles of A/D conversion per clock cycle in the cyclic mode will be described.

Figure 8:
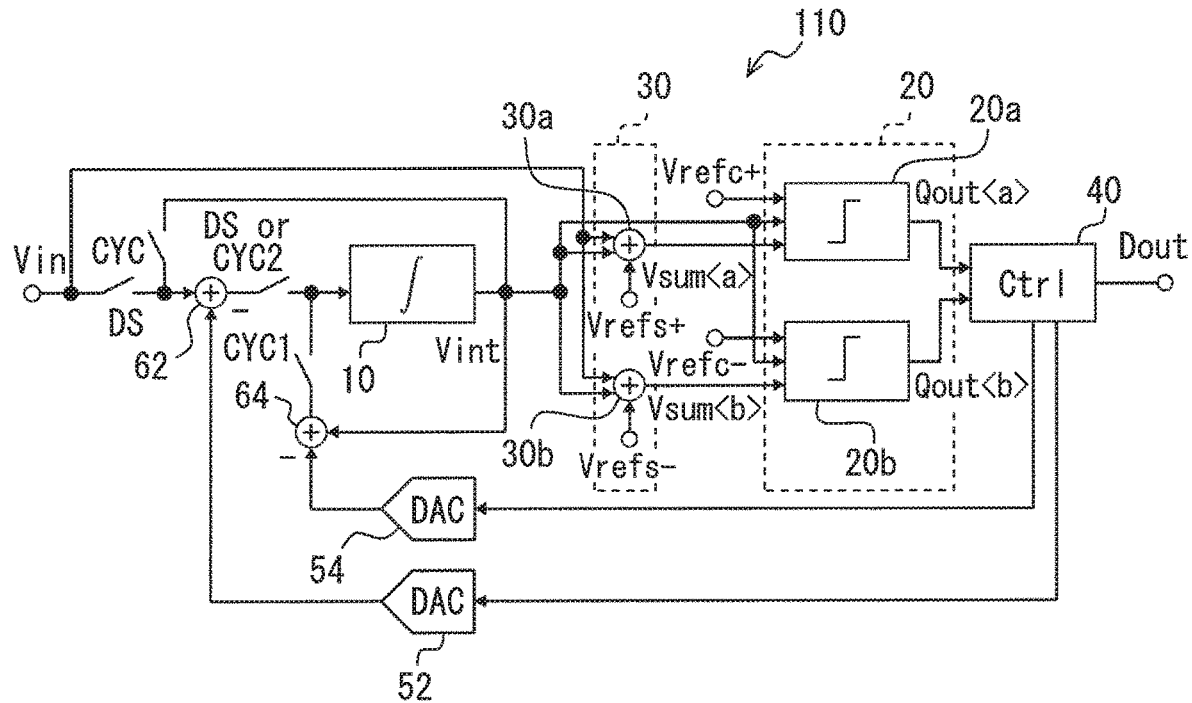
FIG. 8 is a block diagram illustrating a configuration of an A/D converter in a second embodiment.

The A/D converter 110 in the present embodiment includes two each D/A converters and subtractors. Namely, the A/D converter 110 has one more D/A converter and one more subtractor as compared to the A/D converter 100 of the first embodiment. More specifically, as shown in FIG. 8, the A/D converter 110 includes a first DAC 52, a second DAC 54, a first subtractor 62, and a second subtractor 64. The first DAC 52 corresponds to the DAC 50 of the first embodiment. The first DAC 52 is connected to the first subtractor 62. The first subtractor 62 corresponds to the subtractor 60 of the first embodiment. A switch CYC2 is interposed between the first subtractor 62 and the integrator circuit 10. The second subtractor 64 is connected via a switch CYC1 to a connection point between the switch CYC2 and the integrator circuit 10. The second DAC 54 is interposed between the controller 40 and the second subtractor 64. The output signal Vint of the integrator circuit 10 is connected to the first subtractor 62 via the switch CYC as with the first embodiment. In addition, the output signal Vint is connected also to the second subtractor 64 in the present embodiment. The connection between the integrator circuit 10 and the second subtractor 64 becomes effective when the switch CYC1 is on. When the switch CYC1 is on, the second subtractor 64 subtracts the output signal of the second DAC 54 from the output signal Vint of the integrator circuit 10, and the output signal of the second subtractor 64, which is the subtraction result, is connected to the input of the integrator circuit 10.

In FIG. 8, reference sign DS denotes the switches that are turned on in the ΔΣ modulation mode. Reference sign CYC denotes the switches CYC that are turned on in the cyclic mode. Reference sign CYC1 denotes the switches CYC1 that are turned on in the cyclic mode wherein subtraction is performed via the second DAC 54. Reference sign CYC2 denotes the switches CYC2 that are turned on in the cyclic mode wherein subtraction is performed via the first DAC 52. The switches DS or CYC2 interposed between the output terminal of the first subtractor 62 and the input terminal of the integrator circuit 10 are turned on in the ΔΣ modulation mode, and also in the cyclic mode when subtraction is performed via the first DAC 52.

Specific operations of the A/D converter 110 in the present embodiment will be described with reference to FIG. 9 to FIG. 11.

Figure 9:
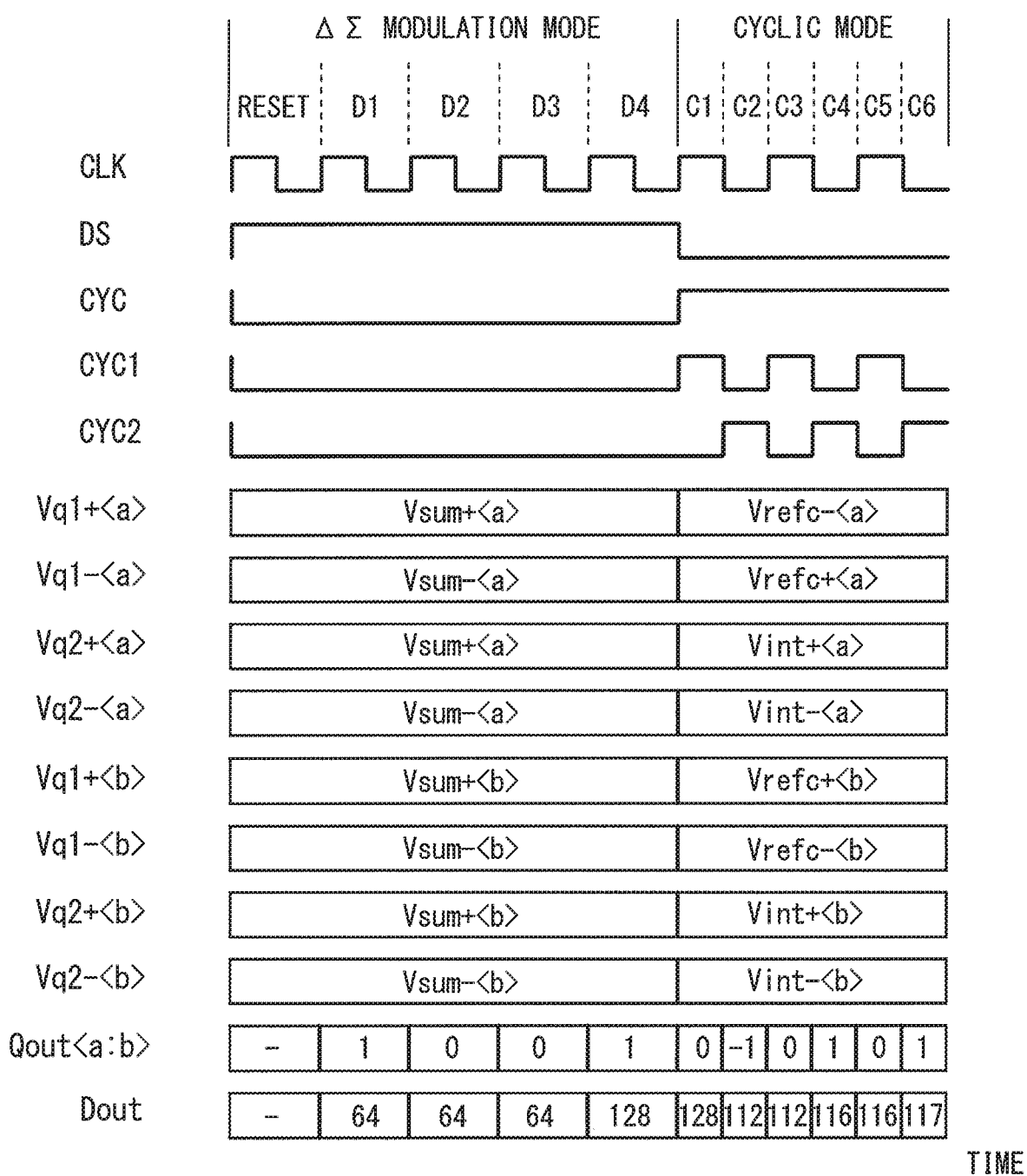
FIG. 9 is a chronological timing chart showing the operation of the A/D converter.

FIG. 9 shows a timing chart of the operation of the A/D converter 110 according to the present embodiment. CYC1 represents a state of ON or OFF of the switches CYC1. When CYC1 is High, the switches CYC1 are on, and when CYC1 is Low, the switches CYC1 are off. CYC2 represents a state of ON or OFF of the switches CYC2. When CYC2 is High, the switches CYC2 are on, and when CYC2 is Low, the switches CYC2 are off.

As shown in FIG. 9, a reset operation is executed first. The reset operation is similar to that of the first embodiment and will not be described again.

Next, the controller 40 causes the A/D converter 110 to operate in the ΔΣ modulation mode. More specifically, the controller turns on the switches DS and turns off the switches CYC. The switches DS or CYC2 interposed between the output terminal of the first subtractor 62 and the input terminal of the integrator circuit 10 are turned on. As a result, the connection state of the A/D converter 110 shown in FIG. 8 becomes substantially the same as that of the ΔΣ modulation mode in the first embodiment (FIG. 6). As with the first embodiment, quantization is executed for 4 cycles in the ΔΣ modulation mode in the present embodiment. The quantization operations are similar to the ΔΣ modulation operations of the first embodiment and will not be described again.

Next, the controller 40 causes the A/D converter 110 to operate in the cyclic mode. More specifically, the controller 40 turns on the switches CYC and turns off the switches DS. In addition, the controller turns on the switches CYC1, while turning off the switches DS or CYC2 interposed between the output terminal of the first subtractor 62 and the input terminal of the integrator circuit 10. This brings the quantizer 20 to the connection state shown in FIG. 4, and the A/D converter 110 shown in FIG. 8 substantially to the connection state shown in FIG. 10. This connection state is substantially the same as that of the cyclic mode in the first embodiment.

Figure 10:
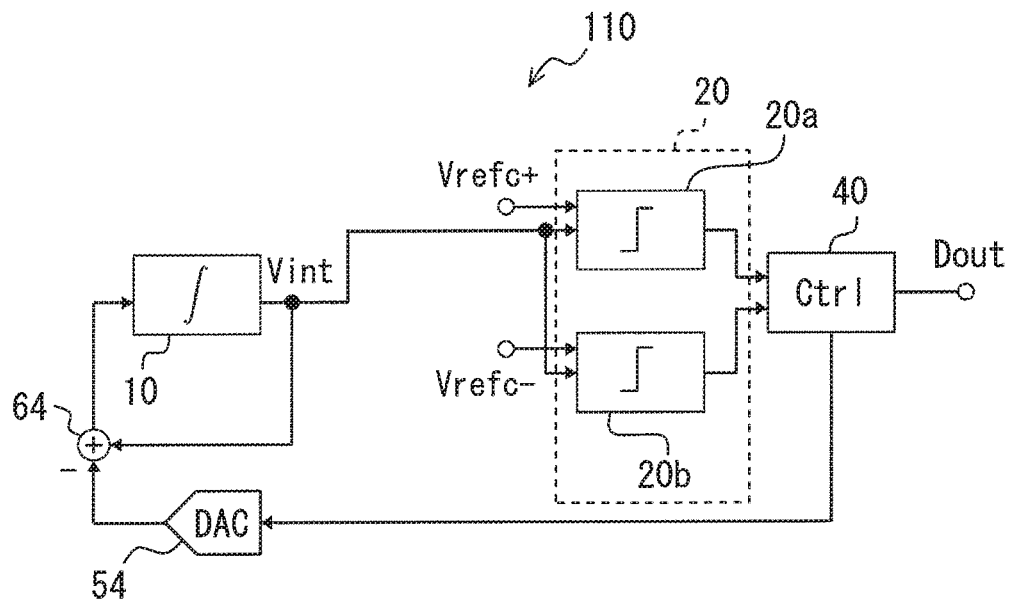
FIG. 10 is a circuit diagram illustrating a connection state of the A/D converter when switch CYC1 is turned on in the cyclic mode.
Figure 11:
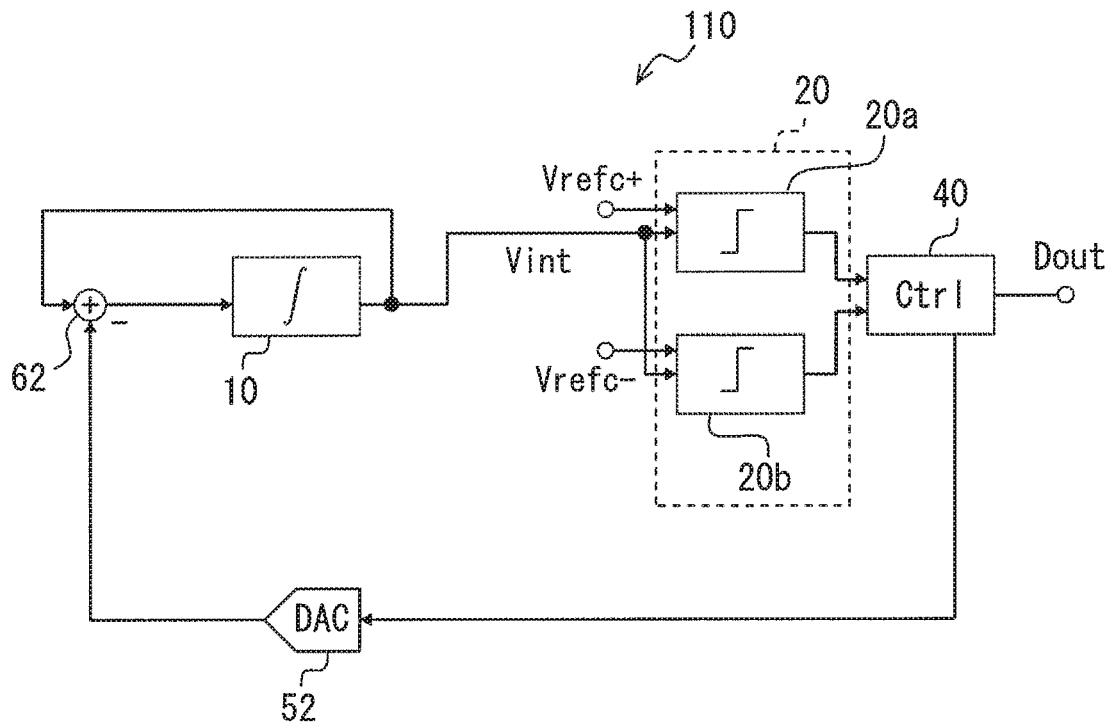
FIG. 11 is a circuit diagram illustrating a connection state of the A/D converter when switch CYC2 is turned on in the cyclic mode.

Immediately after execution of A/D conversion in the connection state shown in FIG. 10, i.e., after ½ clock cycle after the start of the cyclic mode, the switches CYC1 are turned off, and the switches DS or CYC2 are turned on. This brings the A/D converter 110 shown in FIG. 8 substantially to the connection state shown in FIG. 11. The second DAC 54 and the second subtractor 64 are switched to the first DAC 52 and first subtractor 62 respectively in the D/A converter for executing subtraction based on the quantization result, but the operation is substantially the same as that when the switches CYC1 are on.

Namely, an A/D conversion with the switches CYC1 being on and an A/D conversion with the switches CYC2 being on are performed successively during 1 clock cycle. That is to say, 2 cycles of cyclic A/D conversion are executed during 1 clock cycle. In the first embodiment, one cycle of cyclic A/D conversion takes 1 clock cycle. In the present embodiment, 2 cycles of cyclic A/D conversion are executed during 1 clock cycle, i.e., the time required for cyclic A/D conversion is reduced. In the present embodiment, two differential signals, the second reference signal Vrefc and the output of the integrator circuit 10, are directly input to the comparator 22 without the adder 30 during the execution of cyclic A/D conversion. The delay time caused by the adder 30 therefore does not affect the speed of quantization by the quantizer 20. Since the quantization with two sets of differential signals as input signals is executed highly accurately with the use of the comparator 22 having two sets of differential inputs, the quantizer 20 can execute quantization at high speed while maintaining quantization accuracy. Thus, the A/D converter 110 is capable of executing 2 cycles of A/D conversion during 1 clock cycle without losing accuracy.

Third Embodiment

In the first embodiment and second embodiment, A/D converters that use single ΔΣ modulation were described. In the present embodiment, an A/D converter that uses double ΔΣ modulation will be described.

Figure 12:
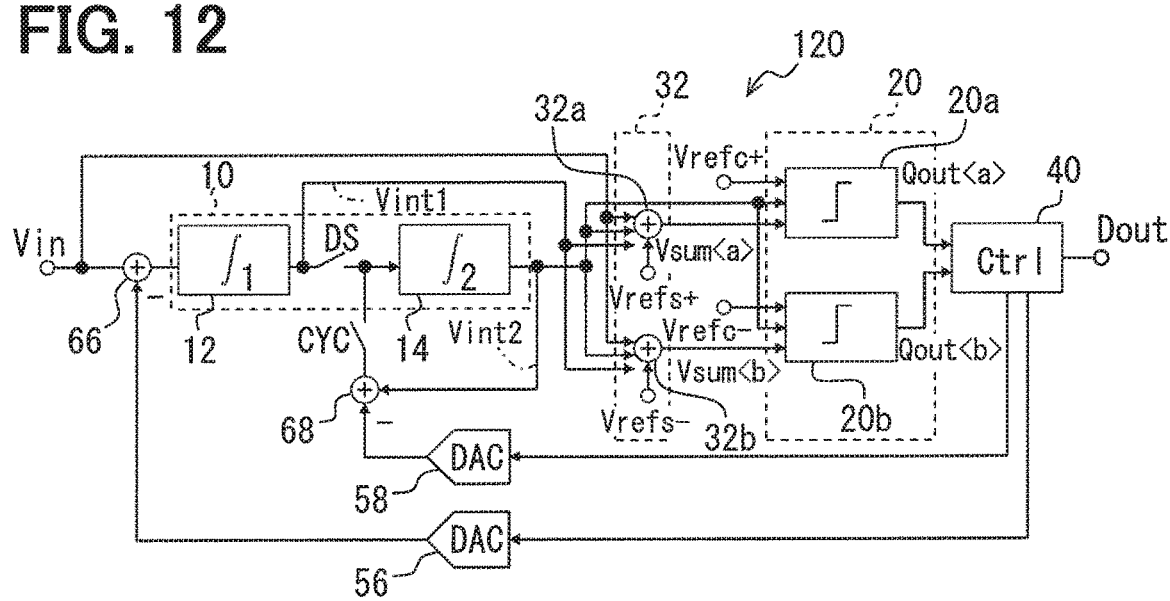
FIG. 12 is a block diagram illustrating a configuration of an A/D converter in a third embodiment.

The A/D converter 120 of the present embodiment includes, as shown in FIG. 12, a first integrator 12 and a second integrator 14 as the integrator circuit 10, a quantizer 20, an adder 32, a controller 40, a first DAC 56, a second DAC 58, a first subtractor 66, and a second subtractor 68.

The analog signal Vin is input to the first integrator 12 via the first subtractor 66. The first subtractor 66 functions similarly to the subtractor 60 of the first embodiment.

Namely, the first subtractor 66 subtracts the output signal of the first DAC 56 to be described later from Vin, and the subtraction result is input to the first integrator 12. The output signal of the first integrator 12 shall be denoted as Vint1. To indicate the polarity, the output signal shall be denoted as Vint1+ or Vint1−. Vint1 is input to the second integrator 14 via a switch DS, and input also to the adder 32 to be described later.

The input terminal of the second integrator 14 is connected to the output terminal of the first integrator 12 via the switch DS. The output signal Vint2 of the second integrator 14 is output to the adder 32 or quantizer 20, and output also to the second subtractor 68. The second subtractor 68 functions similarly to the second subtractor 64 of the second embodiment; it executes subtraction to Vint2 based on the quantization result and inputs the subtraction result to the second integrator 14 via a switch CYC.

The quantizer 20 may have the comparator 22 and switch unit 24 configured similarly to those of the first embodiment, as shown in FIG. 2. Note, however, the signals input to the switch unit 24 denoted as Vint+ and Vint− in FIG. 2 shall be understood as Vint2+ and Vint2−, respectively.

Signals input to the adder 32 are, as shown in FIG. 12, first reference signals Vrefs+ and Vrefs− of opposite polarities that are the reference voltages in the ΔΣ modulation mode, the analog signals Vin+ and Vin− of opposite polarities that are the conversion target, the output signals Vint1+ and Vint1− of opposite polarities of the first integrator 12, and the output signals Vint2+ and Vint2− of opposite polarities of the second integrator 14. The adder 32 includes two adders 32a and 32b corresponding to the quantizer 20. The adder 32a and adder 32b have the same configuration, except for the polarity of the first reference signal Vrefs.

The adder 32a or adder 32b performs addition based on input signals, and outputs the results to the quantizer 20 as Vsum. While the adder 30 of the first or second embodiment includes the output signal Vint of the integrator circuit 10 as the addition target, the adder 32 of the present embodiment includes the output Vint1 of the first integrator 12 and the output Vint2 of the second integrator 14 instead of Vint as the addition target. The addition results Vsum+ and Vsum− of this adder 32 also contain Vin+ and Vin− components that are analog signals to be converted, and the addition results are input to the quantizer 20 in the ΔΣ modulation mode. That is to say, the A/D converter 120 configures a 2nd-order feed-forward ΔΣ modulator in the ΔΣ modulation mode.

Similarly to the first or second embodiment, the controller 40 generates A/D conversion results Dout of analog signals Vin based on the quantization results Qout generated by the quantizer 20. The controller 40 controls the first DAC 56 and second DAC 58 to be described later based on Qout to determine the output signals of the DAC for the subtraction in the ΔΣ modulation mode and cyclic mode.

The first DAC 56 and second DAC 58 are commonly known capacitive D/A converters, for example. The first DAC 56 inputs a preset voltage to a DAC capacitor (not shown) based on control signals output from the controller 40. Subtraction is performed by the first subtractor 66 based on the voltage input to the DAC capacitor in the first DAC 56. The second DAC 58 inputs a preset voltage to a DAC capacitor (not shown) based on control signals output from the controller 40. Subtraction is performed by the second subtractor 68 based on the voltage input to the DAC capacitor in the second DAC 58. The first DAC 56 and second DAC 58 of the present embodiment correspond to a first D/A converter and a second D/A converter, respectively.

Figure 14:
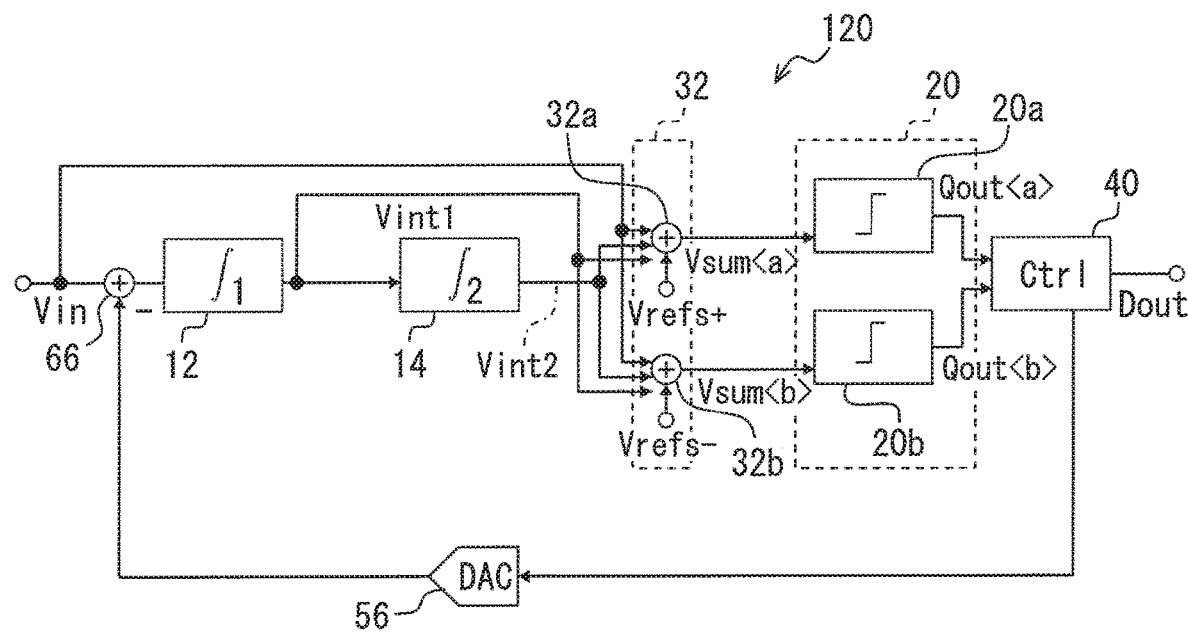
FIG. 14 is a circuit diagram illustrating a connection state of the A/D converter in the $\Delta\Sigma$ modulation mode.
Figure 15:
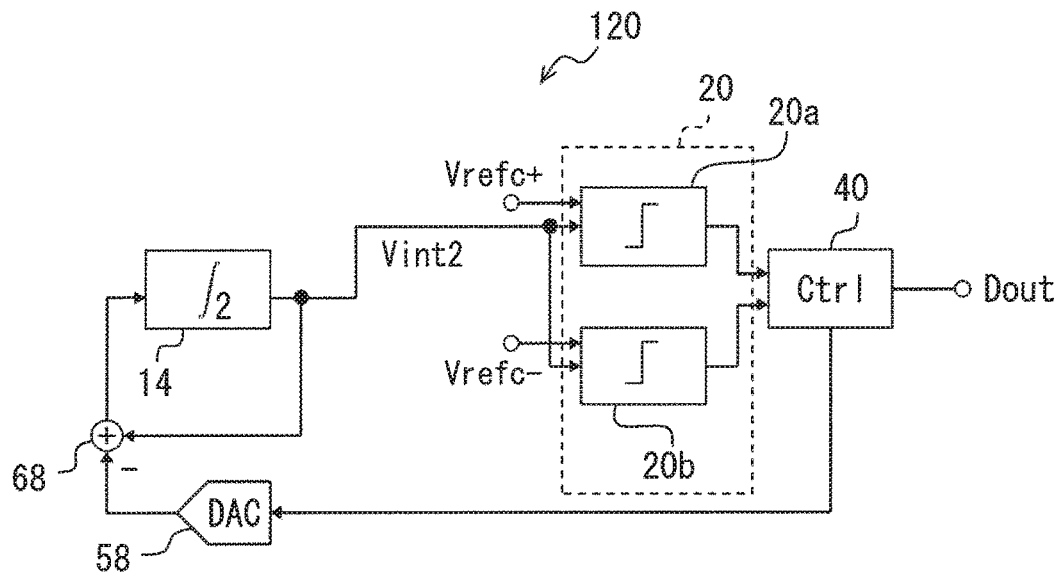
FIG. 15 is a circuit diagram illustrating a connection state of the A/D converter in the cyclic mode.

Next, the operation of the A/D converter 120 will be described with reference to FIG. 13 to FIG. 15.

Figure 13:
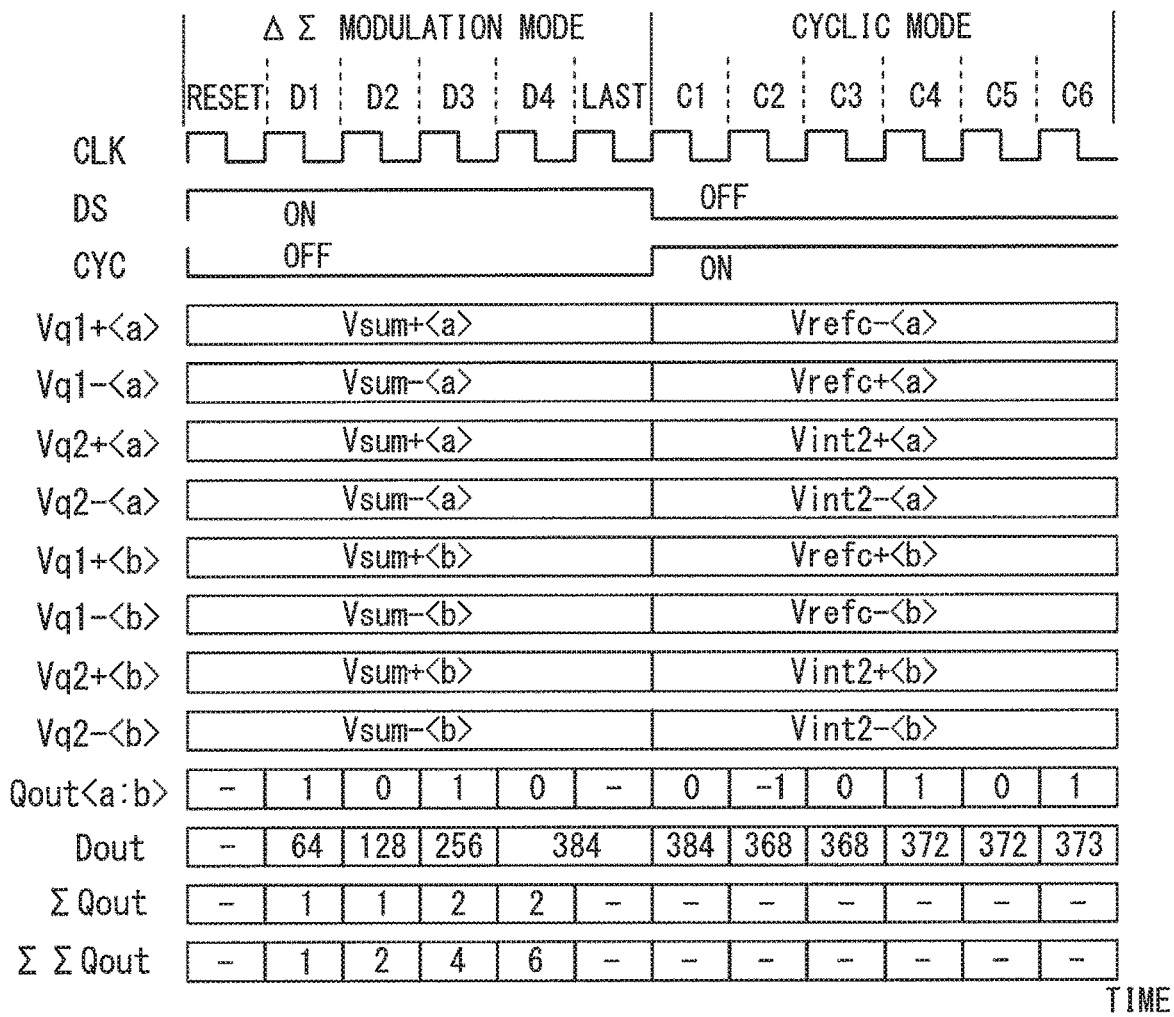
FIG. 13 is a chronological timing chart showing the operation of the A/D converter.

FIG. 13 shows a timing chart of the operation of the A/D converter 120 according to the present embodiment. ΣQout represents an integral value of Qout<a:b>, which is an A/D conversion of the analog signal Vin. ΣΣQout is an integral value of ΣQout, i.e., a double integral value of Qout<a:b>, which is an A/D conversion of the analog signal Vin. The A/D conversion result Dout is calculated based on the double integral value ΣΣQout in the present embodiment. In this example, 4 cycles of quantization are executed in the ΔΣ modulation mode after a reset operation. A LAST phase is provided after that for the subtraction result based on the last quantization result in the ΔΣ modulation mode to be transferred from the first integrator 12 to the second integrator 14. After that, 6 cycles of cyclic A/D conversion are executed. Namely, an A/D conversion is completed in 12 clock cycles including the reset operation and LAST phase.

More specifically, as shown in FIG. 13, a reset operation is executed first. In the reset operation, the switch DS is turned on, and the potential of the capacitive elements, op-amps and the like included in the first integrator 12, second integrator 14, first DAC 56, and second DAC 58 are reset to a ground level or the like.

Next, the controller 40 causes the A/D converter 120 to operate in the ΔΣ modulation mode. More specifically, the controller turns on the switches DS and turns off the switches CYC. This brings the quantizer 20 to the connection state shown in FIG. 3, and the A/D converter 120 shown in FIG. 12 and FIG. 2 substantially to the connection state shown in FIG. 14 (Vint+ and Vint− should be interpreted as Vint2+ and Vint2−, respectively).

More specifically, in the ΔΣ modulation mode, while the output signal of the first DAC 56 is subtracted from the analog signal Vin by the first subtractor 66, the output signal of the first subtractor 66 is integrated successively by the first integrator 12 and second integrator 14, after which the adder 30 performs addition, and the quantizer 20 quantizes the output signal of the adder 30. The A/D converter 120 here operates as a feed-forward ΔΣ modulator wherein the adder 32 adds the analog signal Vin to the output signals of the first integrator 12 and second integrator 14.

In the A/D conversion of the present embodiment, 4 cycles of quantization are executed in the ΔΣ modulation mode. Namely, as shown in FIG. 13, the quantization result Qout<a:b> by the quantizer 20 changes from 1 to 0, from 0 to 1, and from 1 to 0 during the four cycles of quantization, and the double integral value (ΣΣQout) changes from 1 to 2, from 2 to 4, and from 4 to 6. Therefore, the overall A/D conversion result Dout of the A/D converter 120, which is the A/D conversion result in the ΔΣ modulation mode translated to high-order bits, changes from 64 to 128, from 128 to 256, and from 256 to 384.

The controller 40 does not perform quantization in the next 1 clock cycle, and the process moves on to the LAST phase for transferring signals remaining in the first integrator 12 to the second integrator 14.

Next, the controller 40 causes the A/D converter 120 to operate in the cyclic mode. More specifically, the controller turns on the switches CYC and turns off the switches DS. This brings the quantizer 20 to the connection state shown in FIG. 4, and the A/D converter 120 shown in FIG. 12 to the connection state shown in FIG. 15. This is substantially the same as the connection state of the cyclic mode in the first embodiment. The operations of the A/D converter 120 in the cyclic mode in the present embodiment are therefore the same as those of the first embodiment, and will not be described again. In the cyclic mode, 6 cycles of A/D conversion are performed. Namely, as shown in FIG. 13, Qout<a:b> changes from 0 to −1, from −1 to 0, from 0 to 1, from 1 to 0, and from 0 to 1 during the six cycles of cyclic A/D conversion, and the A/D conversion result Dout changes from 384 to 368, from 368 to 368, from 368 to 372, from 372 to 372, and from 372 to 373, as a result of suitable weighted addition of the quantization result to the A/D conversion result Dout similarly to a common cyclic A/D converter.

Next, the effects of adopting the A/D converter 120 of the present embodiment will be described.

The A/D converter 120 in the present embodiment operates as a feed-forward double $\Delta\Sigma$ modulator in the $\Delta\Sigma$ modulation mode, and operates as a cyclic A/D converter in the cyclic mode. Other effects are similar to those of the first embodiment.

Fourth Embodiment

Two cycles of cyclic A/D conversion can be performed per clock cycle in the cyclic mode to increase the speed of cyclic A/D conversion in a configuration wherein double $\Delta\Sigma$ modulation is executed, too. In the present embodiment, a configuration that uses double $\Delta\Sigma$ modulation and allows for faster cyclic A/D conversion will be described.

Figure 16:
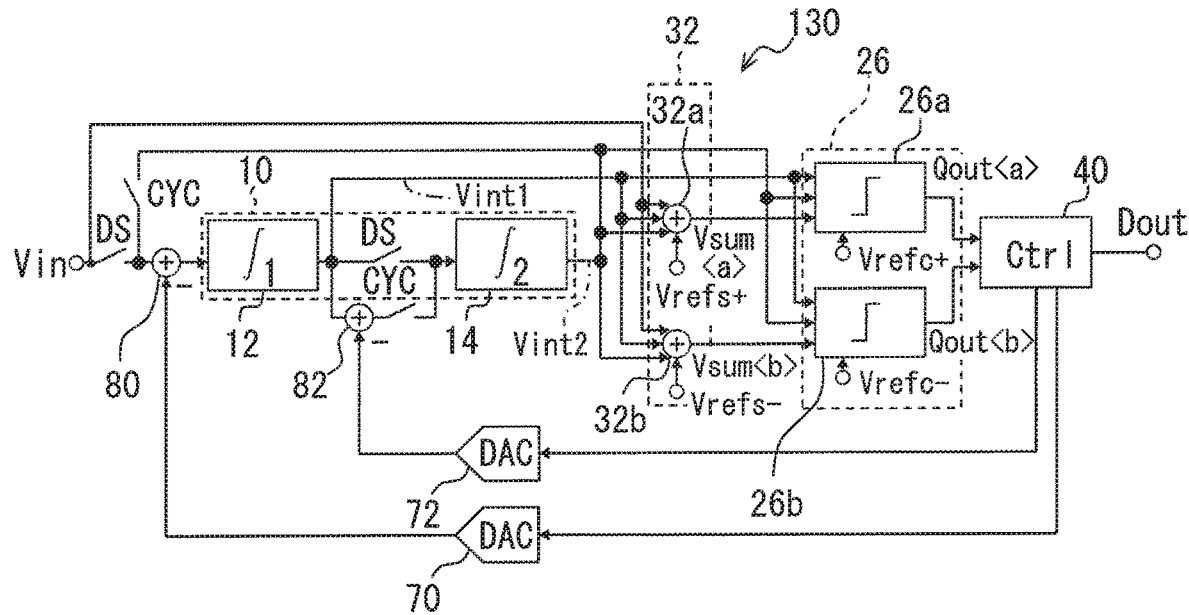
FIG. 16 is a block diagram illustrating a configuration of an A/D converter in a fourth embodiment.

The A/D converter 130 of the present embodiment includes, as shown in FIG. 16, a first integrator 12 and a second integrator 14 as the integrator circuit 10, a quantizer 26, an adder 32, a controller 40, a first DAC 70, a second DAC 72, a first subtractor 80, and a second subtractor 82.

The first integrator 12 is similar to the first integrator 12 of the third embodiment, i.e., the analog signal Vin is input thereto via the first subtractor 80. The first subtractor 80 functions similarly to the first subtractor 66 of the third embodiment. Namely, subtraction as defined by the first DAC 70 to be described later is performed to Vin, before being input to the first integrator 12. Vint1 is input to the second integrator 14 via a switch DS, and input also to the quantizer 26 and adder 32 to be described later.

The second integrator 14 is also similar to the second integrator 14 of the third embodiment, i.e., the output terminal of the first integrator 12 is connected to the input terminal of the second integrator 14 via the switch DS. The output signal Vint2 of the second integrator 14 is output to the adder 32 or the quantizer 26, and can be input to the input terminal of the first integrator 12 via the switch CYC.

A series circuit of the second subtractor 82 and the switch CYC is provided in parallel to the switch DS between the output terminal of the first integrator 12 and the input terminal of the second integrator 14. The second subtractor 82 becomes effective in the cyclic mode when the switch CYC is turned on, so that it can subtract the output signal of the second DAC 72 from the output signal of the first integrator 12 before it is input to the input terminal of the second integrator 14.

The quantizer 26, to which the output signal Vint1 of the first integrator 12, the output signal Vint2 of the second integrator 14, and an addition result Vsum that is the output signal of the adder 32 to be described later are input, quantizes these output signals and outputs the quantization result Qout. The quantizer 26 of the present embodiment is a 1.5-bit quantizer. Namely, the quantizer 26 of the present embodiment has a quantizer 26a and a quantizer 26b, and Vint1, Vint2, Vsum, and reference voltage Vrefc to be described later are input to each of them.

Figure 17:
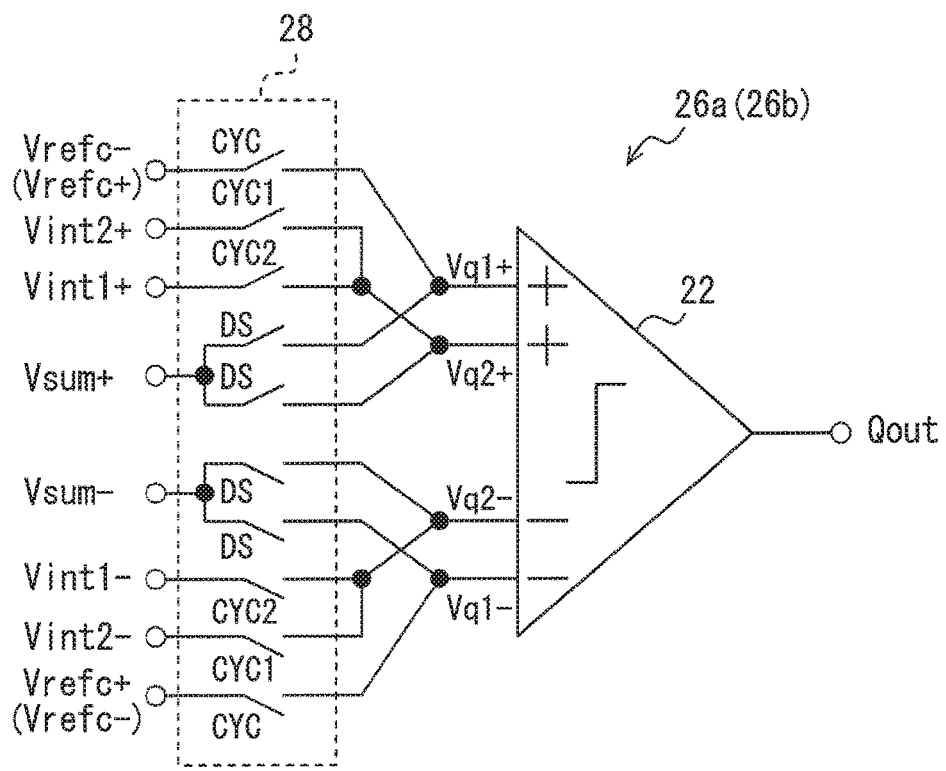
FIG. 17 is a circuit diagram illustrating a detailed configuration of a quantizer.

FIG. 17 illustrates the configuration of the quantizer 26. The quantizer 26 includes a comparator 22 and a switch unit 28. The comparator 22 is the same as that of the first embodiment and will not be described again. As compared to the switch unit 24 described in the first embodiment, Vint1 and Vint2 can be input to the switch unit 28 instead of Vint. As shown in FIG. 17, the addition results Vsum+ and Vsum− of opposite polarities, and second reference signal Vrefc+ and Vrefc− of opposite polarities are input similarly to the switch unit 24 described in the first embodiment. To the terminal to which Vint+ is input in the first embodiment, Vint1+ can be input when the switch CYC2 is on, and Vint2+ can be input when the switch CYC1 is on. To the terminal to which Vint− is input in the first embodiment, Vint1− can be input when the switch CYC2 is on, and Vint2− can be input when the switch CYC1 is on.

The adder 32 is similar to the adder 32 described in the third embodiment and will not be described again.

Similarly to the first to third embodiment, the controller 40 generates A/D conversion results Dout of analog signals Vin based on the quantization results Qout generated by the quantizer 26. The controller 40 controls the first DAC 70 and second DAC 72 to be described later based on Qout to determine the output signals of the first DAC 70 and second DAC 72 for the subtraction in the $\Delta\Sigma$ modulation mode and cyclic mode.

The first DAC 70 and second DAC 72 are commonly known capacitive D/A converters, for example. The first DAC 70 inputs a preset voltage to a DAC capacitor (not shown) based on the control signal output from the controller 40 based on the quantization result Qout. Subtraction is performed by the first subtractor 80 based on the voltage input to the DAC capacitor in the first DAC 70. The second DAC 72 inputs a preset voltage to a DAC capacitor (not shown) based on the control signal output from the controller 40 based on the quantization result Qout. Subtraction is performed by the second subtractor 82 based on the voltage input to the DAC capacitor in the second DAC 72. The first DAC 70 and second DAC 72 of the present embodiment correspond to a first D/A converter and a second D/A converter, respectively.

Figure 19:
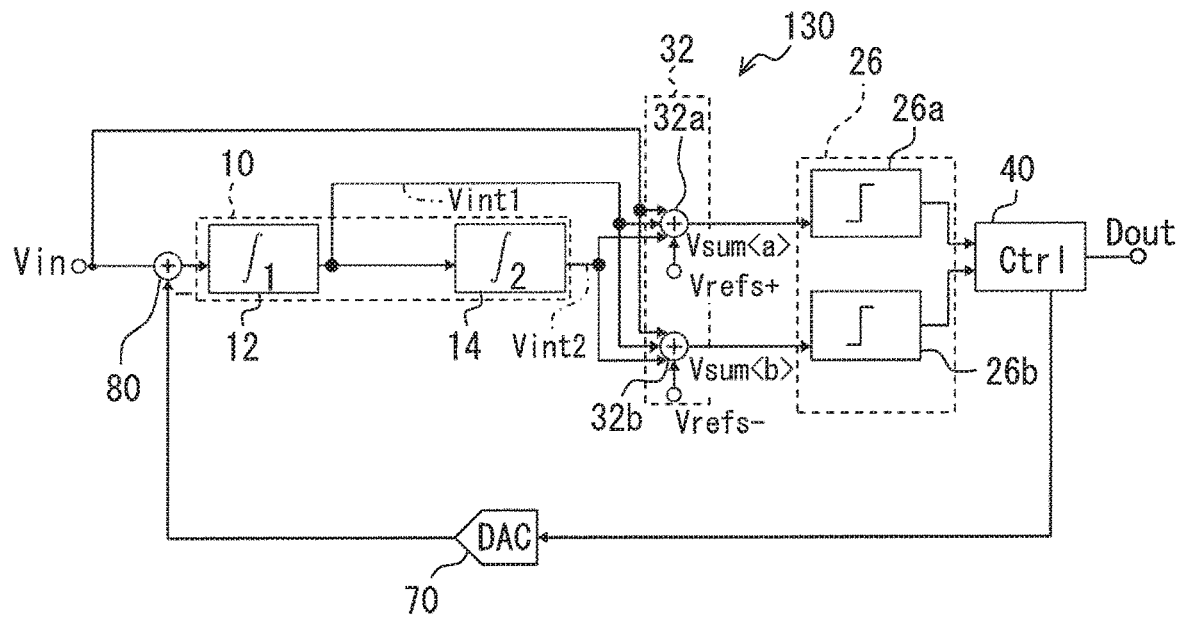
FIG. 19 is a circuit diagram illustrating a connection state of the A/D converter in the $\Delta\Sigma$ modulation mode.
Figure 20:
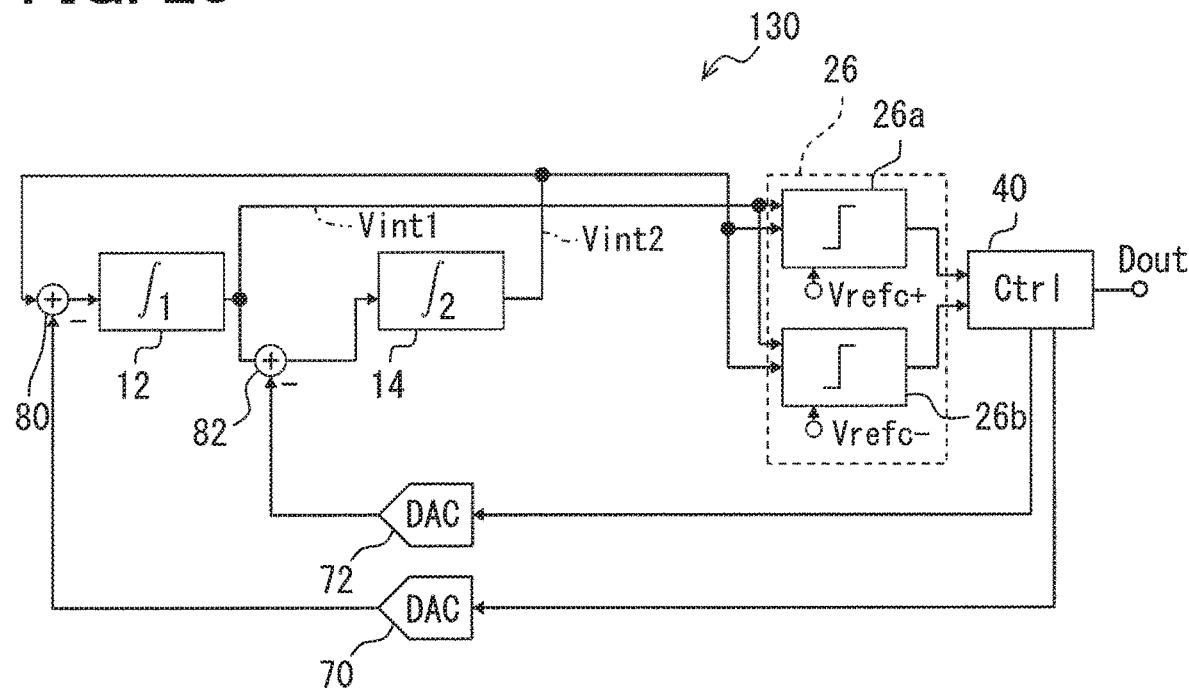
FIG. 20 is a circuit diagram illustrating a connection state of the A/D converter in the cyclic mode.

Next, the operation of the A/D converter 130 will be described with reference to FIG. 18 to FIG. 20.

Figure 18:
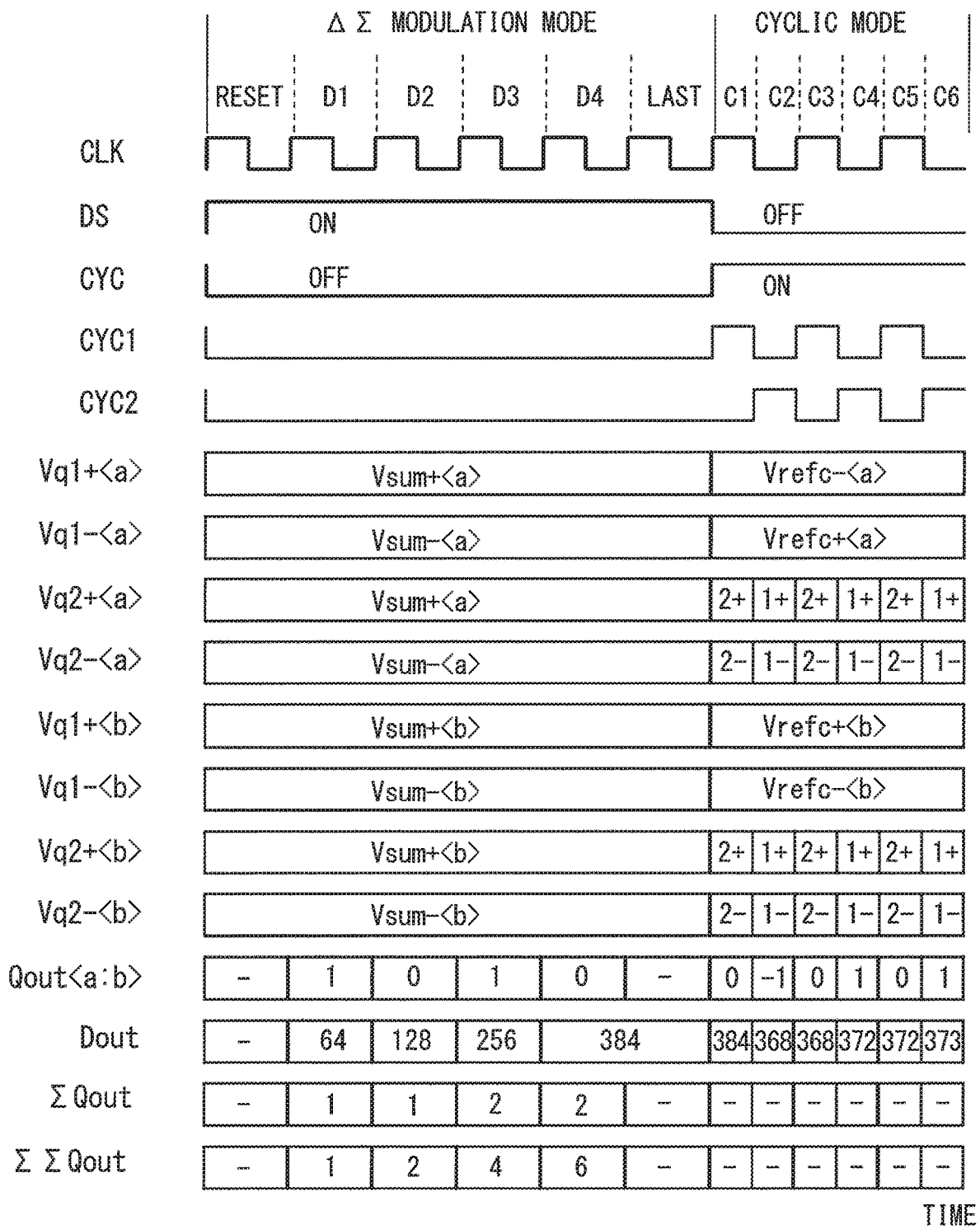
FIG. 18 is a chronological timing chart showing the operation of the A/D converter.

FIG. 18 shows a timing chart of the operation of the A/D converter 130 according to the present embodiment. In this example, similarly to the third embodiment described above, 4 cycles of quantization are executed in the $\Delta\Sigma$ modulation mode after a reset operation. LAST phase is provided after that for transferring signals from the first integrator 12 to the second integrator 14. After that, 6 cycles of cyclic A/D conversion are executed. In the present embodiment, 2 cycles of cyclic A/D conversion are performed during 1 clock cycle. Namely, an A/D conversion is completed in 9 clock cycles in the entire A/D converter 130 including the reset operation and LAST phase.

The operations of the A/D converter 130 will be described in more specific terms. As shown in FIG. 18, a reset operation is executed first. In the reset operation, the switch DS is turned on, and the potential of the integrator elements, op-amps and the like included in the first integrator 12, second integrator 14, first DAC 70, and second DAC 72 is reset to a preset potential such as an analog ground level or the like.

Next, the controller 40 causes the A/D converter 130 to operate in the $\Delta\Sigma$ modulation mode. More specifically, the controller turns on the switches DS and turns off the switches CYC. This brings the A/D converter 130 shown in FIG. 16 and FIG. 17 substantially to the connection state shown in FIG. 19. This connection state of the A/D converter 130 in the ΔΣ modulation mode is substantially the same as that of the ΔΣ modulation mode in the third embodiment and will not be described in detail. Similarly to the third embodiment, Dout, the A/D conversion result in the ΔΣ modulation mode, changes from 64 to 128, from 128 to 256, and from 256 to 384.

The controller 40 does not perform quantization in the next 1 clock cycle, and the process moves on to the LAST phase for transferring signals remaining in the first integrator 12 to the second integrator 14.

Next, the controller 40 causes the A/D converter 130 to operate in the cyclic mode. More specifically, the controller turns on the switches CYC and turns off the switches DS. This brings the A/D converter 130 shown in FIG. 16 and FIG. 17 substantially to the connection state shown in FIG. 20. In the present embodiment, as shown in FIG. 17, the switch unit 28 includes switches CYC1 and switches CYC2. Therefore, either Vint2+ or Vint1+ is applied to Vq2+, according to the open/close states of the switch CYC1 and switch CYC2. Similarly, either Vint2− or Vint1− is applied to Vq1−, according to the open/close states of the switch CYC1 and switch CYC2.

As shown in FIG. 18, immediately after switching to the cyclic mode, the switches CYC1 are turned on and the switches CYC2 are turned off. Thus, Vint2− and Vint2+, and the second reference signals Vrefc− and Vrefc+, as a comparison target, are input to the comparator 22 for the quantizer 26 to execute quantization. The controller 40 controls the output signal of the first DAC 70 based on the quantization result, and the first subtractor 80 and first integrator 12 execute subtraction and amplification.

After ½ clock cycle from then, i.e., from the start of the cyclic mode, the switches CYC1 are turned off, and the switches CYC2 are turned on. Vint1− and Vint1+, and the second reference signals Vrefc− and Vrefc+, as a comparison target, are input to the comparator 22 for the quantizer 26 to execute quantization. The controller 40 controls the output signal of the second DAC 72 based on the quantization result, and the second subtractor 82 and second integrator 14 execute subtraction and amplification.

Namely, similarly to the second embodiment, an A/D conversion with the switches CYC1 being on and an A/D conversion with the switches CYC2 being on are performed successively during 1 clock cycle. That is to say, 2 cycles of cyclic A/D conversion are executed during 1 clock cycle. In the third embodiment, one cycle of cyclic A/D conversion takes 1 clock cycle. In the present embodiment, 2 cycles of cyclic A/D conversion are executed during 1 clock cycle, i.e., the time required for cyclic A/D conversion is reduced. Also, since the second reference signal Vrefc, and Vint1 and Vint2 are directly input to the comparator 22, the delay time of the adder does not affect the speed of quantization by the quantizer 26. Since the quantization with up to two sets of differential signals as input signals is executed highly accurately with the use of the comparator 22 having two sets of differential inputs, the quantizer 26 can execute quantization at high speed while maintaining quantization accuracy. Thus, the A/D converter 130 is capable of executing 2 cycles of cyclic A/D conversion during 1 clock cycle without losing accuracy.

The subtraction and amplification operations executed using the first DAC 70, first subtractor 80, and first integrator 12, or the subtraction and amplification operations executed using the second DAC 72, second subtractor 82, and second integrator 14, are similar to the operations of an MDAC (Multiplying DAC) used in a common cyclic A/D converter. The first DAC 70, first subtractor 80, and first integrator 12, or the second DAC 72, second subtractor 82, and second integrator 14 shown in FIG. 20 are connected in the order such as to match the style of FIG. 16, but may be connected in different orders as long as they exhibit similar functions. The first integrator 12 and second integrator 14 are controlled by the controller 40 so as to exhibit amplifier functions rather than integrator functions in the cyclic mode. The amplification factor may be set suitably such as twice or the like required for a cyclic A/D converter.

(Modifications)

Figure 21:
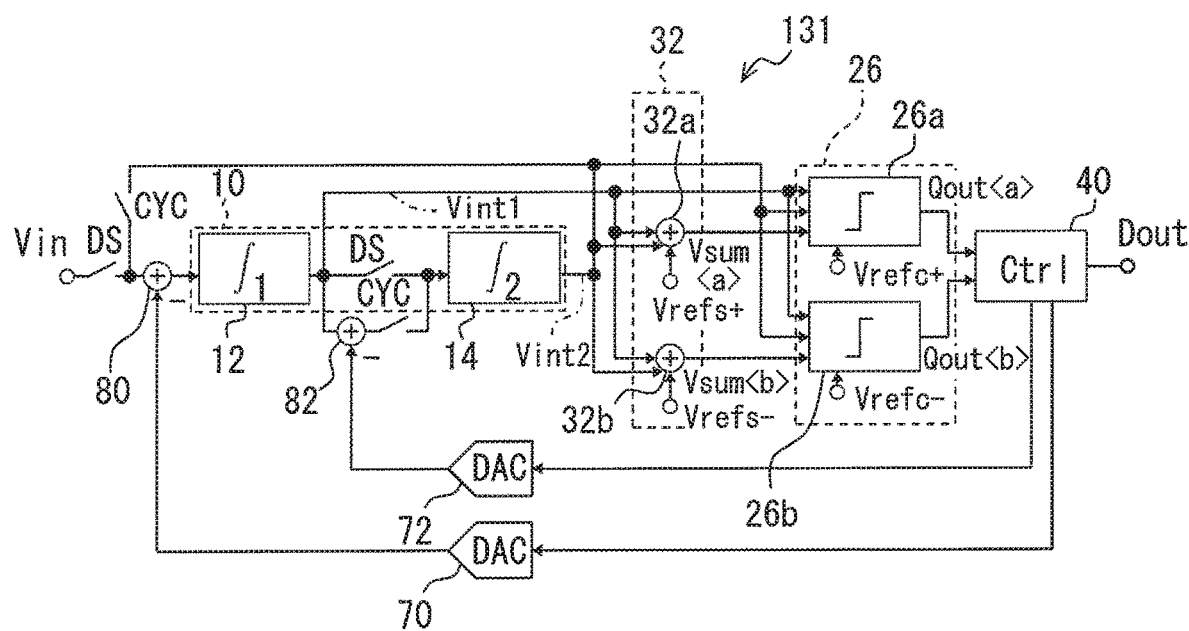
FIG. 21 is a block diagram illustrating a configuration of an A/D converter in a modified embodiment.

The A/D converter 130 in the fourth embodiment may adopt a feed-forward ΔΣ modulator that inputs, or feeds forward, only Vint1, the output signal of the first integrator 12, to the adder 32 and does not feed-forward the analog signal Vin. The A/D converter 131 in the present modification shown in FIG. 21 corresponds to a configuration wherein the input path of Vin to the adder 32 is omitted from the A/D converter 130 of the fourth embodiment.

Since the analog signal Vin is not fed forward, sampling of the analog signal Vin is performed by the first integrator 12 alone via the first subtractor 80, and is not performed by the adder 32 or quantizer 26 in the quantization by the A/D converter 131 in the ΔΣ modulation mode. Therefore, even when Vin varies largely, for example, the time lag in sampling timing between the sampling by the first integrator 12 and the sampling by the adder 32 or quantizer 26 hardly affects the ΔΣ modulation. The A/D converter 131 is thus capable of executing quantization in the feed-forward ΔΣ modulation mode with reduced influence of Vin variations. Similarly to the fourth embodiment, 2 cycles of cyclic A/D conversion can be executed during 1 clock cycle.

Other Embodiments

While preferred embodiments of the present disclosure have been described above, the present disclosure is not limited in any way by the embodiments described above, and may be carried out with various modifications without departing from the scope of the subject matter of the present disclosure.

While the quantizer 20 or 26 is described as a 1.5-bit quantizer that uses two comparators in various embodiments described above, it is not intended to limit the effective resolution of the quantizer or the number of comparator to specific values. For example, a configuration that achieves an effective resolution of 1 bit with one comparator, or a configuration that achieves an effective resolution of multiple bits using multiple comparators, can also be selected.

While the adder 30 or 32 is described as an adder that simply has an adding function in various embodiments described above, it is not intended to limit the adder to a specific type, and the adder can be implemented by any circuit having an adding function. Various configurations that have an adding function such as, for example, an adder circuit with a switched capacitor, an active adder circuit that uses an op-amp, and so on, can be selected.

While a capacitive D/A converter is shown as a D/A converter in various embodiments described above, it is not intended to limit the D/A converter to a capacitive type, and any D/A converter controllable based on quantization results Qout may be used.

The values of quantization results Qout, integral values ΣQout and ΣΣQout thereof, and A/D conversion results Dout shown in the timing charts of FIG. 5, FIG. 9, FIG. 13, and FIG. 18 are only examples and it is not intended to limit the styles or calculation methods of the A/D conversion results or quantization results to particular styles or methods. Similarly, the number of cycles of ΔΣ modulation or the number of cycles of cyclic A/D conversion are not limited to particular values and the number of cycles may be selected in accordance with the required conversion accuracy and conversion speed.

While the configurations shown in various embodiments described above use single-loop single or double ΔΣ modulators for ΔΣ modulation, it is not intended to limit the ΔΣ modulators to particular configurations, and various other configurations such as even higher order ΔΣ modulators and cascade type ΔΣ modulators may be selected. Similarly, it is not intended to limit the combination of the ΔΣ modulator and the cyclic A/D converter to those described herein, but various other combinations may be selected in accordance with required conversion accuracy and conversion speed, or the available amount of hardware, such as, for example, a combination of the feed-forward ΔΣ modulator shown in the modification and the cyclic A/D converter shown in the third embodiment.

While the configurations described in various embodiments above use differential signals, configurations that use single-ended signals can also be adopted.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. An A/D converter comprising:
an integrator circuit that executes ΔΣ modulation to an analog signal as an input signal to be converted;
an adder that outputs an addition result of at least an output signal of the integrator circuit and a first reference signal as a reference signal in the ΔΣ modulation;
a quantizer that receives the output signal of the integrator circuit, an output signal of the adder, and a second reference signal as a reference signal in cyclic A/D conversion to generate a result of quantization of the output signal of the integrator circuit and the output signal of the adder; and
a controller that is configured to switch between a ΔΣ modulation mode in which the integrator circuit, the adder and the quantizer are operated as a ΔΣ modulator and a cyclic mode in which the integrator circuit and the quantizer are operated as a cyclic A/D converter, and that is configured to generate an A/D conversion result of the analog signal based on the quantization result,
wherein:
the quantizer includes
a comparator, and
a switch unit interposed between the integrator circuit and the comparator and between the adder and the comparator to switch over mutual connection states of the integrator circuit, the adder and the comparator; and
the controller
controls the switch unit to input only the addition result to the comparator in the ΔΣ modulation mode, and
controls the switch unit to input the output signal of the integrator circuit and the second reference signal, which is to be a comparison value for the output signal of the integrator circuit, to the comparator in the cyclic mode.

2. The A/D converter according to claim 1, wherein:
the adder outputs an addition result of the analog signal, the output signal of the integrator circuit, and the first reference signal; and
the controller controls the integrator circuit, the adder, and the quantizer to operate as a feed-forward ΔΣ modulator in the ΔΣ modulation mode.

3. The A/D converter according to claim 1,
wherein the integrator circuit has a single integrator.

4. The A/D converter according to claim 1,
wherein the controller
controls an output signal of a first D/A converter in accordance with the quantization result to execute the ΔΣ modulation in the ΔΣ modulation mode, and
controls the output signal of the first D/A converter and an output signal of a second D/A converter in accordance with the quantization result to enable executing the cyclic A/D conversion in the cyclic mode.

5. The A/D converter according to claim 1, wherein:
the integrator circuit includes a first integrator and a second integrator;
the first integrator sends an output signal to the adder;
the second integrator sends an output signal to the adder and the quantizer;
the adder adds up at least the output signal of the first integrator, the output signal of the second integrator, and the first reference signal; and
the controller
controls an output signal of a first D/A converter in accordance with the quantization result to execute feed-forward ΔΣ modulation in the ΔΣ modulation mode, and
controls an output signal of a second D/A converter in accordance with the quantization result to execute the cyclic A/D conversion in the cyclic mode.

6. The A/D converter according to claim 5,
wherein the controller controls the output signal of the first D/A converter and the output signal of the second D/A converter in accordance with the quantization result to execute the cyclic A/D conversion.

7. The A/D converter according to claim 6, wherein:
the output signal of the first integrator is sent to the quantizer and the adder;
the switch unit is configured to switch between the output signal of the first integrator and the output signal of the second integrator in the cyclic mode; and
the controller controls the switch unit to execute the cyclic A/D conversion while switching between the output signal of the first integrator and the output signal of the second integrator in the cyclic mode.

8. The A/D converter according to claim 5,
wherein the quantizer stops executing the quantization before one last clock cycle in the ΔΣ modulation mode immediately before switching from the ΔΣ modulation mode to the cyclic mode.

9. The A/D converter according to claim 6,
wherein the controller controls the output signal of the first D/A converter and the output signal of the second D/A converter in accordance with the quantization result alternately for every cycle of A/D conversion in the cyclic mode to execute the cyclic A/D conversion.

10. The A/D converter according to claim 1,
wherein the quantizer executes the quantization twice per clock cycle in the cyclic mode.

11. The A/D converter according to claim 1, wherein the adder is configured by a switched-capacitor circuit.

* * * * *